(12) United States Patent
Baheti et al.

(10) Patent No.: US 10,505,255 B2
(45) Date of Patent: Dec. 10, 2019

(54) RADIO FREQUENCY DEVICE PACKAGES AND METHODS OF FORMATION THEREOF

(71) Applicant: Infineon Technologies AG, Neubiberg (DE)

(72) Inventors: Ashutosh Baheti, München (DE); Saverio Trotta, München (DE); Werner Reiss, Raubling (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 241 days.

(21) Appl. No.: 15/419,225

(22) Filed: Jan. 30, 2017

(65) Prior Publication Data

US 2018/0219272 A1 Aug. 2, 2018

(51) Int. Cl.
*H01Q 1/22* (2006.01)
*H01Q 1/52* (2006.01)
*H01Q 9/04* (2006.01)

(52) U.S. Cl.
CPC ........... *H01Q 1/2283* (2013.01); *H01Q 1/521* (2013.01); *H01Q 9/0407* (2013.01)

(58) Field of Classification Search
CPC .............................. H01Q 1/2283; H01Q 1/521
See application file for complete search history.

(56) References Cited

U.S. PATENT DOCUMENTS

| | | | |
|---|---|---|---|
| 4,241,347 A | 12/1980 | Albanese et al. | |
| 6,147,572 A | 11/2000 | Kaminski et al. | |
| 6,414,631 B1 | 7/2002 | Fujimoto | |
| 6,636,174 B2 | 10/2003 | Arikan et al. | |
| 6,686,649 B1 * | 2/2004 | Mathews | H01L 23/552 257/659 |
| 6,770,955 B1 | 8/2004 | Coccioli et al. | |
| 7,048,973 B2 | 5/2006 | Sakamoto et al. | |
| 7,057,564 B2 | 6/2006 | Tsai et al. | |
| 7,119,745 B2 * | 10/2006 | Gaucher | H01Q 9/26 343/700 MS |

(Continued)

FOREIGN PATENT DOCUMENTS

| | | |
|---|---|---|
| CN | 1463161 A | 12/2003 |
| CN | 1716695 A | 1/2006 |

(Continued)

OTHER PUBLICATIONS

Chen, Xiaolong et al., "Detection and Extraction of Target with Micromotion in Spiky Sea Clutter via Short-Time Fractional Fourier Transform", IEEE Transactions on Geoscience and Remote Sensing, vol. 52, No. 2, Feb. 2014, pp. 1002-1018.

(Continued)

*Primary Examiner* — Daniel Munoz
(74) *Attorney, Agent, or Firm* — Slater Matsil, LLP

(57) ABSTRACT

A semiconductor device package includes a radio frequency front end circuit configured to process radio frequency signals, a first antenna, an antenna substrate, and a first conductive barrier. The first antenna is configured to transmit/receive a first radio frequency signal. The antenna substrate includes the first antenna. The antenna substrate is configured to transfer the first radio frequency signal between the radio frequency front end circuit and the first antenna. The first conductive barrier is configured to electromagnetically and electrostatically isolate the first antenna.

20 Claims, 15 Drawing Sheets

(56) References Cited

U.S. PATENT DOCUMENTS

| | | |
|---|---|---|
| 7,171,052 B2 | 1/2007 | Park |
| 7,317,417 B2 | 1/2008 | Arikan et al. |
| 7,596,241 B2 | 9/2009 | Rittscher et al. |
| 7,692,574 B2 | 4/2010 | Nakagawa |
| 7,873,326 B2 | 1/2011 | Sadr |
| 7,889,147 B2 | 2/2011 | Tam et al. |
| 8,228,382 B2 | 7/2012 | Pattikonda |
| 8,497,805 B2 | 7/2013 | Rofougaran et al. |
| 8,659,369 B2 | 2/2014 | Rofougaran et al. |
| 8,731,502 B2 | 5/2014 | Salle et al. |
| 8,836,596 B2 | 9/2014 | Richards et al. |
| 8,847,814 B2 | 9/2014 | Himmelstoss et al. |
| 8,860,532 B2 | 10/2014 | Gong et al. |
| 8,976,061 B2 | 3/2015 | Chowdhury |
| 9,172,132 B2 | 10/2015 | Kam et al. |
| 9,202,105 B1 | 12/2015 | Wang et al. |
| 9,413,079 B2 | 8/2016 | Kamgaing et al. |
| 9,495,600 B2 | 11/2016 | Heu et al. |
| 9,886,095 B2 | 2/2018 | Pothier |
| 9,935,065 B1 | 4/2018 | Baheti et al. |
| 2003/0179127 A1 | 9/2003 | Wienand |
| 2004/0238857 A1 | 12/2004 | Beroz et al. |
| 2006/0001572 A1 | 1/2006 | Gaucher et al. |
| 2006/0049995 A1 | 3/2006 | Imaoka et al. |
| 2006/0067456 A1 | 3/2006 | Ku et al. |
| 2007/0210959 A1 | 9/2007 | Herd et al. |
| 2007/0262828 A1* | 11/2007 | Fujita ............... H01P 5/107 333/26 |
| 2008/0106460 A1 | 5/2008 | Kurtz et al. |
| 2008/0238759 A1 | 10/2008 | Carocari et al. |
| 2008/0291115 A1 | 11/2008 | Doan et al. |
| 2008/0308917 A1 | 12/2008 | Pressel et al. |
| 2009/0073026 A1 | 3/2009 | Nakagawa |
| 2009/0085815 A1 | 4/2009 | Jakab et al. |
| 2009/0153428 A1 | 6/2009 | Rofougaran et al. |
| 2009/0315761 A1 | 12/2009 | Walter et al. |
| 2010/0207805 A1 | 8/2010 | Haworth |
| 2011/0299433 A1 | 12/2011 | Darabi et al. |
| 2012/0087230 A1 | 4/2012 | Guo et al. |
| 2012/0092284 A1 | 4/2012 | Rofougaran et al. |
| 2012/0116231 A1 | 5/2012 | Liao et al. |
| 2012/0195161 A1 | 8/2012 | Little et al. |
| 2012/0206339 A1 | 8/2012 | Dahl |
| 2012/0212384 A1 | 8/2012 | Kam et al. |
| 2012/0280900 A1 | 11/2012 | Wang et al. |
| 2013/0027240 A1 | 1/2013 | Chowdhury |
| 2013/0106673 A1 | 5/2013 | McCormack et al. |
| 2014/0028542 A1 | 1/2014 | Lovitt et al. |
| 2014/0070994 A1 | 3/2014 | Schmalenberg et al. |
| 2014/0145883 A1 | 5/2014 | Baks et al. |
| 2014/0252595 A1 | 9/2014 | Yen et al. |
| 2014/0324888 A1 | 10/2014 | Xie et al. |
| 2015/0070228 A1 | 3/2015 | Gu et al. |
| 2015/0180116 A1* | 6/2015 | Sato ............... H01Q 21/24 343/841 |
| 2015/0181840 A1 | 7/2015 | Tupin, Jr. et al. |
| 2015/0185316 A1 | 7/2015 | Rao et al. |
| 2015/0212198 A1 | 7/2015 | Nishio et al. |
| 2015/0243575 A1 | 8/2015 | Strothmann et al. |
| 2015/0277569 A1 | 10/2015 | Sprenger et al. |
| 2015/0325925 A1 | 11/2015 | Kamgaing et al. |
| 2015/0346820 A1 | 12/2015 | Poupyrev et al. |
| 2015/0348821 A1 | 12/2015 | Iwanaga et al. |
| 2015/0364816 A1 | 12/2015 | Murugan et al. |
| 2016/0018511 A1 | 1/2016 | Nayyar et al. |
| 2016/0041617 A1 | 2/2016 | Poupyrev |
| 2016/0041618 A1 | 2/2016 | Poupyrev |
| 2016/0061942 A1 | 3/2016 | Rao et al. |
| 2016/0061947 A1 | 3/2016 | Patole |
| 2016/0098089 A1 | 4/2016 | Poupyrev |
| 2016/0103213 A1 | 4/2016 | Ikram et al. |
| 2016/0109566 A1 | 4/2016 | Liu et al. |
| 2016/0118353 A1 | 4/2016 | Ahrens et al. |
| 2016/0146931 A1 | 5/2016 | Rao et al. |
| 2016/0146933 A1 | 5/2016 | Rao et al. |
| 2016/0178730 A1 | 6/2016 | Trotta et al. |
| 2016/0187462 A1 | 6/2016 | Altus et al. |
| 2016/0191232 A1 | 6/2016 | Subburaj et al. |
| 2016/0240907 A1 | 8/2016 | Haroun |
| 2016/0249133 A1 | 8/2016 | Sorensen |
| 2016/0252607 A1 | 9/2016 | Saboo et al. |
| 2016/0259037 A1 | 9/2016 | Molchanov et al. |
| 2016/0266233 A1 | 9/2016 | Mansour |
| 2016/0269815 A1 | 9/2016 | Liao et al. |
| 2016/0291130 A1 | 10/2016 | Ginsburg et al. |
| 2016/0299215 A1 | 10/2016 | Dandu et al. |
| 2016/0306034 A1 | 10/2016 | Trotta et al. |
| 2016/0320852 A1 | 11/2016 | Poupyrev |
| 2016/0320853 A1 | 11/2016 | Lien et al. |
| 2016/0327633 A1 | 11/2016 | Kumar et al. |
| 2016/0334502 A1 | 11/2016 | Ali et al. |
| 2016/0336646 A1 | 11/2016 | Baek et al. |
| 2016/0349845 A1 | 12/2016 | Poupyrev et al. |
| 2017/0033062 A1 | 2/2017 | Liu et al. |
| 2017/0045607 A1 | 2/2017 | Bharadwaj et al. |
| 2017/0052618 A1 | 2/2017 | Lee et al. |
| 2017/0054449 A1 | 2/2017 | Mani et al. |
| 2017/0060254 A1 | 3/2017 | Molchanov et al. |
| 2017/0070952 A1 | 3/2017 | Balakrishnan et al. |
| 2017/0074974 A1 | 3/2017 | Rao et al. |
| 2017/0074980 A1 | 3/2017 | Adib et al. |
| 2017/0090014 A1 | 3/2017 | Subburaj et al. |
| 2017/0090015 A1 | 3/2017 | Breen et al. |
| 2017/0115377 A1 | 4/2017 | Giannini et al. |
| 2017/0131395 A1 | 5/2017 | Reynolds et al. |
| 2017/0139036 A1 | 5/2017 | Nayyar et al. |
| 2017/0170947 A1 | 6/2017 | Yang |
| 2017/0176574 A1 | 6/2017 | Eswaran et al. |
| 2017/0192847 A1 | 7/2017 | Rao et al. |
| 2017/0201019 A1 | 7/2017 | Trotta |
| 2017/0212597 A1 | 7/2017 | Mishra |
| 2017/0364160 A1 | 12/2017 | Malysa et al. |
| 2018/0046255 A1 | 2/2018 | Rothera et al. |
| 2018/0074173 A1 | 3/2018 | Trotta et al. |
| 2018/0101239 A1 | 4/2018 | Yin et al. |

FOREIGN PATENT DOCUMENTS

| | | |
|---|---|---|
| CN | 101490578 A | 7/2009 |
| CN | 101585361 A | 11/2009 |
| CN | 102024798 A | 4/2011 |
| CN | 102158244 A | 8/2011 |
| CN | 102511110 A | 6/2012 |
| CN | 102788969 A | 11/2012 |
| CN | 102967854 A | 3/2013 |
| CN | 103529444 A | 1/2014 |
| CN | 103779319 A | 5/2014 |
| CN | 203950036 U | 11/2014 |
| DE | 102008054570 A1 | 6/2010 |
| DE | 102011075725 A1 | 11/2012 |
| DE | 102014118063 A1 | 7/2015 |
| GB | 2247799 A | 3/1992 |
| JP | 2001174539 A | 6/2001 |
| JP | 2004198312 A | 7/2004 |
| JP | 2006234513 A | 9/2006 |
| JP | 2007329908 A | 12/2007 |
| JP | 2008029025 A | 2/2008 |
| JP | 2008089614 A | 4/2008 |
| JP | 2009069124 A | 4/2009 |
| JP | 2011529181 A | 12/2011 |
| JP | 2012112861 A | 6/2012 |
| JP | 2013521508 A | 6/2013 |
| JP | 2014055957 A | 3/2014 |
| KR | 20090063166 A | 6/2009 |
| KR | 20140082815 A | 7/2014 |
| WO | 2007060069 A1 | 5/2007 |
| WO | 2013009473 A2 | 1/2013 |
| WO | 2016033361 A1 | 3/2016 |

OTHER PUBLICATIONS

Chen, Xiaolong et al., "Detection and Extraction of Marine Target with Micromotion via Short-Time Fractional Fourier Transform in

(56) References Cited

OTHER PUBLICATIONS

Sparse Domain," IEEE International Conference on Signal Processing, Communications and Computing, ICSPCC, Aug. 5-8, 2016, 5 pages.
Chuanhua, Du, "FMCW Radar Range-Doppler Processing and Beam Formation Technology," Chinese Doctoral Dissertations & Master's Theses Full Text Database (Masters)—Information Science and Technology Series, China National Knowledge Infrastructure, ISSN 1674-0246, CN 11-9144/G, Dec. 16, 2004-Mar. 2015, 14 pages.
Deacon, Peter et al., "Frequency Modulated Continuous Wave (FMCW) Radar," Design Team 6 Technical Lecture, Nov. 9, 2011, 27 pages.
Diederichs, Kailtyn et al., "Wireless Biometric Individual Identification Utilizing Millimeter Waves", IEEE Sensors Letters, vol. 1, No. 1, IEEE Sensors Council 3500104, Feb. 2017, 4 pages.
Dooring Alert Systems, "Riders Matter," http:\\dooringalertsystems.com, printed Oct. 4, 2017, 16 pages.
Filippelli, Mario et al., "Respiratory dynamics during laughter," J Appl Physiol, (90), 1441-1446, Apr. 2001, http://iap.physiology.org/content/jap/90/4/1441.full.pdf.
Fox, Ben, "The Simple Technique That Could Save Cyclists' Lives," https://www.outsideonline.com/2115116/simple-technique-could-save-cyclists-lives, Sep. 19, 2016, 6 pages.
Gu, Changzhan et al., "Assessment of Human Respiration Patterns via Noncontact Sensing Using Doppler Multi-Radar System", Sensors Mar. 2015, 15(3), 6383-6398, doi: 10.3390/s150306383, 17 pages.
Guercan, Yalin "Super-resolution Algorithms for Joint Range-Azimuth-Doppler Estimation in Automotive Radars," Technische Universitet Delft, TUDelft University of Technology Challenge the Future, Jan. 25, 2017, 72 pages.
Inac, Ozgur et al., "A Phased Array RFIC with Built-In Self-Test Capabilities," IEEE Transactions on Microwave Theory and Techniques, vol. 60, No. 1, Jan. 2012, 10 pages.
Kizhakkel, V., "Pulsed Radar Target Recognition Based on Micro-Doppler Signatures Using Wavelet Analysis", A Thesis, Graduate Program in Electrical and Computer Engineering, Ohio State University, Jan. 2013-May 2013, 118 pages.
Kuehnke, Lutz, "Phased Array Calibration Procedures Based on Measured Element Patterns," 2001 Eleventh International Conference on Antennas and Propagation, IEEE Conf., Publ. No. 480, Apr. 17-20, 2001, 4 pages.
Lim, Soo-Chul et al., "Expansion of Smartwatch Touch Interface from Touchscreen to Around Device Interface Using Infrared Line Image Sensors," Sensors 2015, ISSN 1424-8220, vol. 15, 16642-16653, doi:10.3390/s150716642, www.mdpi.com/journal/sensors, Jul. 15, 2009, 12 pages.
Lin, Jau-Jr et al., "Design of an FMCW radar baseband signal processing system for automotive application," SpringerPlus a SpringerOpen Journal, (2016) 5:42, http://creativecommons.org/licenses/by/4.0/, DOI 10.1186/s40064-015-1583-5; Jan. 2016, 16 pages.
Microwave Journal Frequency Mailers, "Single-Chip 24 GHz Radar Front End," Infineon Technologies AG, www.microwavejournal.com/articles/print/21553-single-chip-24-ghz-radar-front-end, Feb. 13, 2014, 2 pages.
Schroff, Florian et al., "FaceNet: A Unified Embedding for Face Recognition and Clustering," CVF, CVPR2015, IEEE Computer Society Conference on Computer Vision and Pattern Recognition; Mar. 12, 2015, pp. 815-823.
Simon, W., et al., "Highly Integrated KA-Band Tx Frontend Module Including 8×8 Antenna Array," IMST GmbH, Germany, Asia Pacific Microwave Conference, Dec. 7-10, 2009, 63 pages.
Suleymanov, Suleyman, "Design and Implementation of an FMCW Radar Signal Processing Module for Automotive Applications," Master Thesis, University of Twente, Aug. 31, 2016, 61 pages.
Thayananthan, T. et al., "Intelligent target recognition using micro-Doppler radar signatures," Defence R&D Canada, Radar Sensor Technology III, Proc. of SPIE, vol. 7308, 730817, Dec. 9, 2009, 11 pages.
Thayaparan, T. et al., "Micro-Doppler Radar Signatures for Intelligent Target Recognition," Defence Research and Development Canada, Technical Memorandum, DRDC Ottawa TM 2004-170, Sep. 2004, 73 pages.
Wilder, Carol N., et al., "Respiratory patterns in infant cry," Canada Journal of Speech, Human Communication Winter, 1974-1975, http://cjslpa.ca/files/1974_HumComm_Vol_01/No_03_2-60/Wilder_Baken_HumComm_1974.pdf, pp. 18-34.
Xin, Qin et al., "Signal Processing for Digital Beamforming FMCW SAR," Hindawi Publishing Corporation, Mathematical Problems in Engineering, vol. 2014, Article ID 859890, http://dx.doi.org/10.1155/2014/859890, 11 pages.
Wikipedia, "Touchscreen," https://en.wikipedia.org/wiki/Touchscreen, May 16, 2018, 16 pages.
Hong, Wonbin, et al. "Multilayer Antenna Package for IEEE 802.11 ad Employing Ultralow-Cost FR4," IEEE Transactions on Antennas and Propagation, vol. 60, No. 12, Dec. 2012, 7 pages.

\* cited by examiner

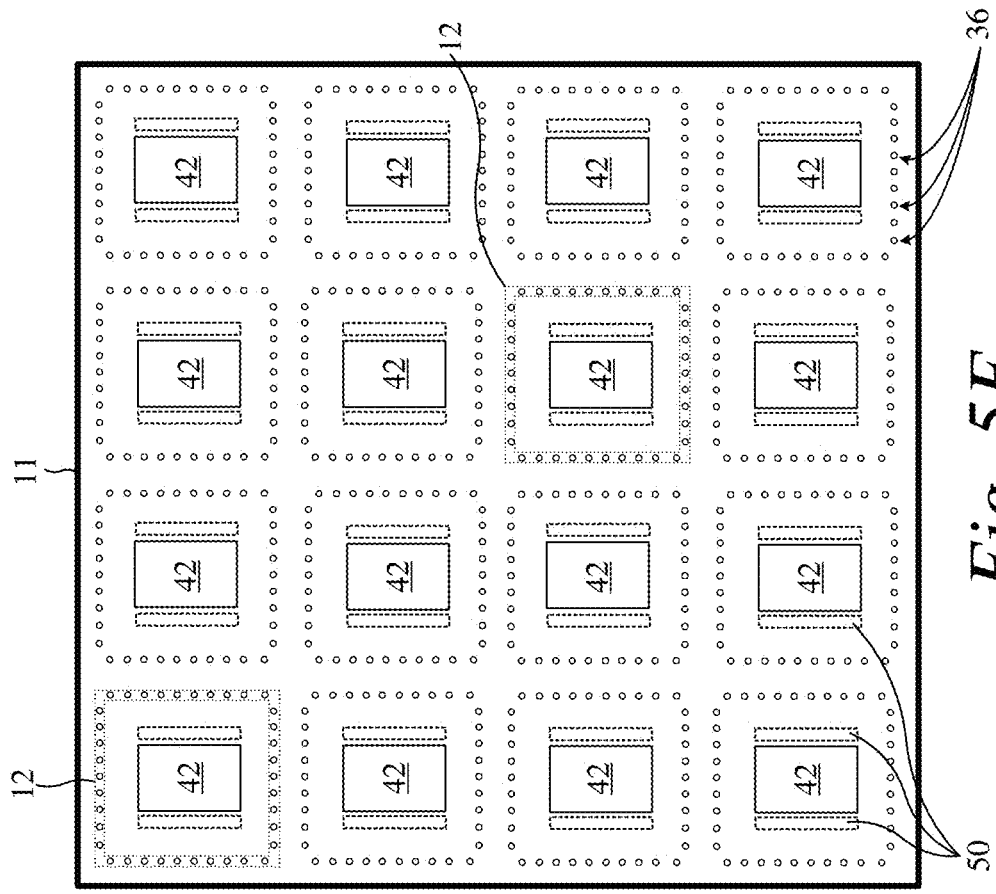
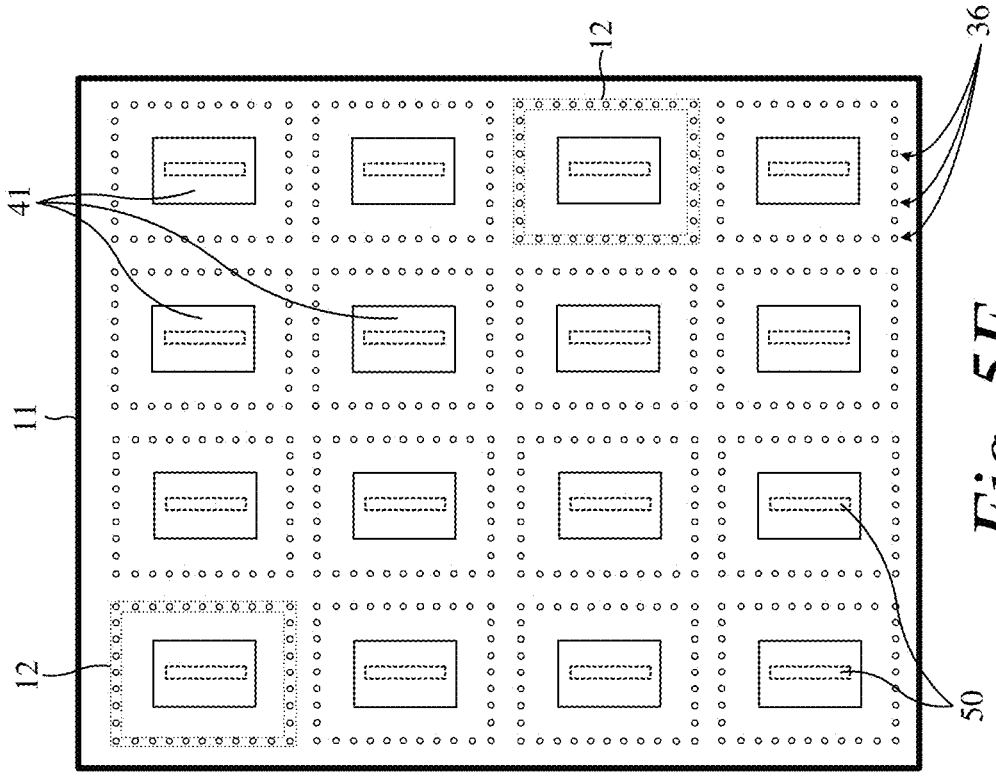

RADIO FREQUENCY DEVICE PACKAGES AND METHODS OF FORMATION THEREOF

TECHNICAL FIELD

The present invention relates generally to a radio frequency electronic device, and, in particular embodiments, to radio frequency electronic device packages and the methods of formation thereof.

BACKGROUND

Portable devices such as tablets, smart phones, and smart watches have become popular recently due to the rapid advancement in low-cost semiconductor technologies. Radio frequency devices utilizing multiple antenna elements such as radar sensors that can detect user motions (known as gesture sensors) may be configured in portable devices as an interface to control functionality of the device. Many portable devices are necessarily small so embedded radar systems with reduced form factors are desirable. Antenna elements embedded in a chip package of a radio frequency (RF) radar system account for a large percentage of the total package size. As a result, antenna location may be a priority during package design of integrated RF multi-antenna systems.

SUMMARY

In accordance with an embodiment of the invention, a semiconductor device package includes a radio frequency front end circuit configured to process radio frequency signals, a first antenna, an antenna substrate, and a first conductive barrier. The first antenna is configured to transmit/receive a first radio frequency signal. The antenna substrate includes the first antenna. The antenna substrate is configured to transfer the first radio frequency signal between the radio frequency front end circuit and the first antenna. The first conductive barrier is configured to electromagnetically and electrostatically isolate the first antenna.

In accordance with another embodiment of the invention, a semiconductor device package includes an integrated circuit chip. The integrated circuit chip includes a radio frequency front end circuit for transmitting/receiving radio frequency signals. The semiconductor device package further includes an antenna substrate disposed over a first surface of the integrated circuit chip. The antenna substrate includes a first antenna and a first conductive barrier. The first conductive barrier has sides extending in a direction perpendicular to a first surface of the antenna substrate. The first conductive barrier is disposed along a periphery of the first antenna.

In accordance with still another embodiment of the invention, a method of forming a radio frequency device package includes forming an integrated circuit chip comprising a radio frequency front end circuit, providing an antenna substrate, forming a first antenna at the antenna substrate, and forming a first conductive barrier at the antenna substrate. The first conductive barrier is formed along a periphery of the first antenna. The method further includes attaching the integrated circuit chip to a first surface of the antenna substrate. The attaching comprises coupling the first antenna to the radio frequency front end circuit.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate a radio frequency device package including multiple antennas in accordance with an embodiment of the invention, wherein FIG. 1A illustrates a top view of the radio frequency device package, wherein FIG. 1B illustrates a bottom view of the radio frequency device package, wherein FIG. 1C illustrates a cross-sectional view of a region of the radio frequency device package, and wherein FIG. 1D illustrates a cross-sectional view of another region of the radio frequency device package;

FIGS. 3A and 3B illustrate top views of schematic layouts of radio frequency device packages in accordance with embodiments of the invention, wherein FIG. 3A illustrates a top view of a schematic layout of a radio frequency device package including single-ended patch antennas, and wherein FIG. 3B illustrates a top view of a schematic layout of a radio frequency device package including differential patch antennas;

FIGS. 5A-5G illustrate top views of schematic layouts of radio frequency device packages in accordance with embodiments of the invention, wherein FIG. 5A illustrates a top view of a schematic layout of a radio frequency device package including one transmitter and two receivers, wherein FIG. 5B illustrates a top view of a schematic layout of a radio frequency device package including one transmitter and four receivers, wherein FIG. 5C illustrates a top view of a schematic layout of a radio frequency device package including two transmitters and four receivers, wherein FIG. 5D illustrates a top view of a schematic layout of a radio frequency device package including one transmitter and seven receivers, wherein FIG. 5E illustrates a top view of a schematic layout of a radio frequency device package including a four by four array of single-ended patch antennas, wherein FIG. 5F illustrates a top view of a schematic layout of a radio frequency device package including a four by four array of differential patch antennas, and wherein FIG. 5G illustrates a top view of a schematic layout of a radio frequency device package including an eight by eight array of antenna elements;

FIGS. 6A-6D illustrate top views of antennas in accordance with additional embodiments of the invention, wherein FIG. 6A illustrates a top view of an antenna including through vias and rectangular through vias, wherein FIG. 6B illustrates a top view of an antenna including square through vias and rectangular through vias, wherein FIG. 6C illustrates a top view of an antenna including square through vias and conductive walls, and wherein FIG. 6D illustrates a top view of an antenna including square through vias and rectangular through vias;

Figure 1A:
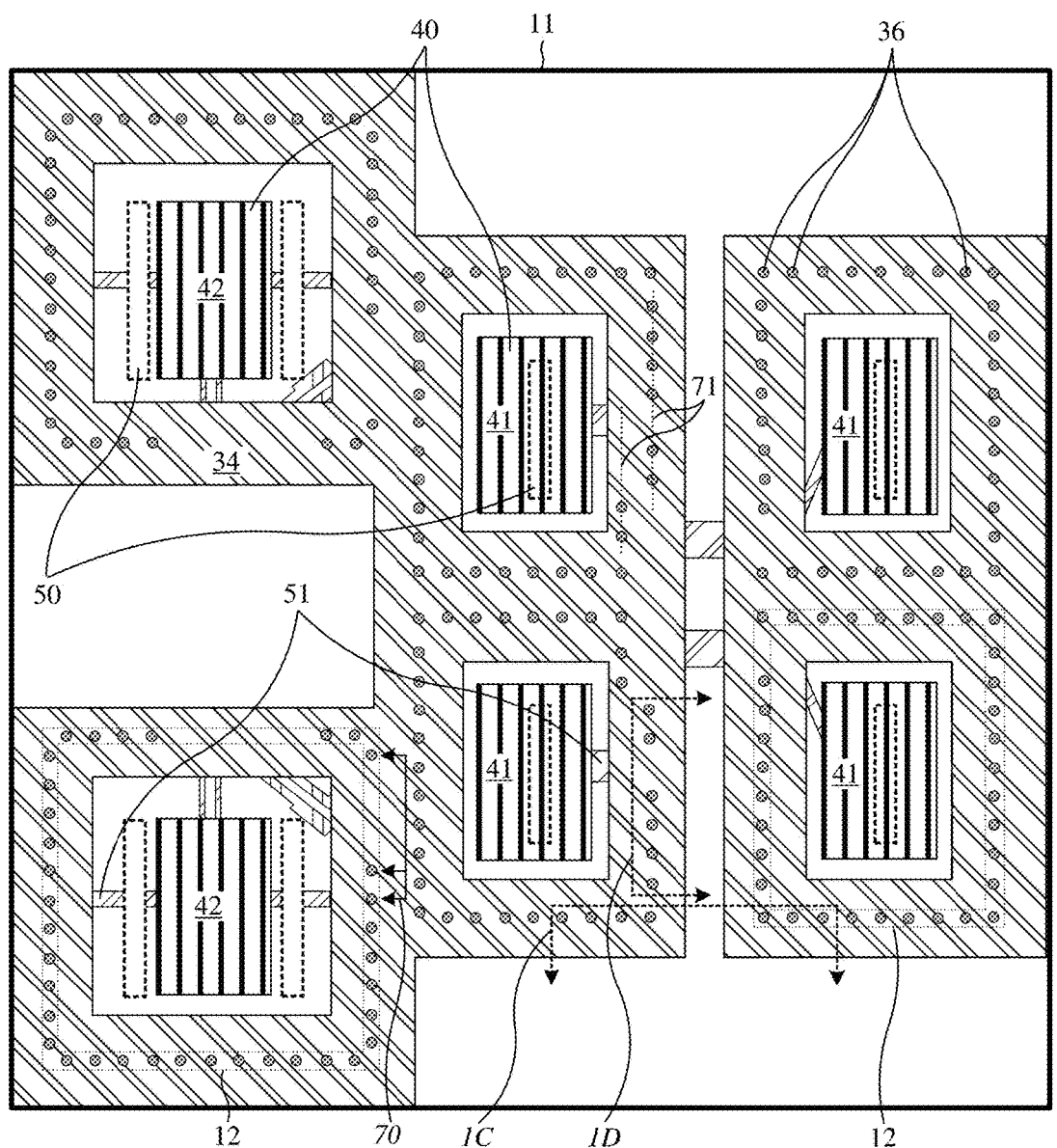

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Multiple antenna elements are used in a number of applications such as automotive radar, industrial radar, gesture sensors, and motion detectors. Sensing applications include level monitoring in storage tanks, smart lighting control, security systems, intelligent door openers, and collision avoidance in vehicles, among others. Multichannel radar systems are primarily used instead of single-channel systems when detection of the angular position of an object is important. In telecommunication applications, for example, in applications that use high frequencies such as $5^{th}$ generation (5G) mobile technologies at 28 GHz, multichannel transceivers may be used for point-to-point communication where beam forming is needed.

In a multichannel implementation such as a gesture sensor system that has multiple antenna elements, the size and spacing of the antenna elements are based on the desired operational frequency. For example, at 60 GHz, the distance between two antenna elements may be 3 to 3.5 mm. Fan-out packaging may be used to integrate antenna elements into the radio frequency device packaging. That is, fan-out packaging may be used for a radio frequency device package containing integrated antenna elements, an integrated circuit chip including circuits designed to receive, process, and transmit radio frequency signals, and various transmission lines and interconnects to couple the components together. However, the large size of the final device package may be prohibitive for some applications. Additionally, a specific ground plane definition may be required on the printed circuit board (PCB) further restricting design considerations.

In other words, the package design may restrict the PCB design because components such as the antenna elements, integrated circuit chips, and transmission lines have size requirements based on the desired operation. Multiple antenna elements may interfere with one another and other electronic components within a radio frequency device package if the antenna elements are spaced closely together. In some cases this can limit the overall size of the radio frequency device package. The following embodiments provide various advantages over conventional radio frequency device packages by utilizing vias to isolate antenna elements in the radio frequency device package.

Embodiments of the invention provided below describe various structures of radio frequency device packages and various methods of fabricating radio frequency device packages, in particular, laminate packages with multiple antenna elements isolated from other device elements using vias, that have advantages over conventional radio frequency device packages. The following description describes the various embodiments. An embodiment radio frequency device package will be described using FIGS. 1-3. An embodiment antenna element in a radio frequency device package will be described using FIG. 4. Several alternative embodiment schematic layouts of a radio frequency device package will be described using FIG. 5. Various alternative embodiment antenna elements will be described using FIG. 6. An embodiment functional block diagram of a semiconductor package including a radio frequency front end circuit and one or more antennas will be described using FIG. 7. An embodiment method of forming a radio frequency device package will be described using FIG. 8.

Figure 1B:
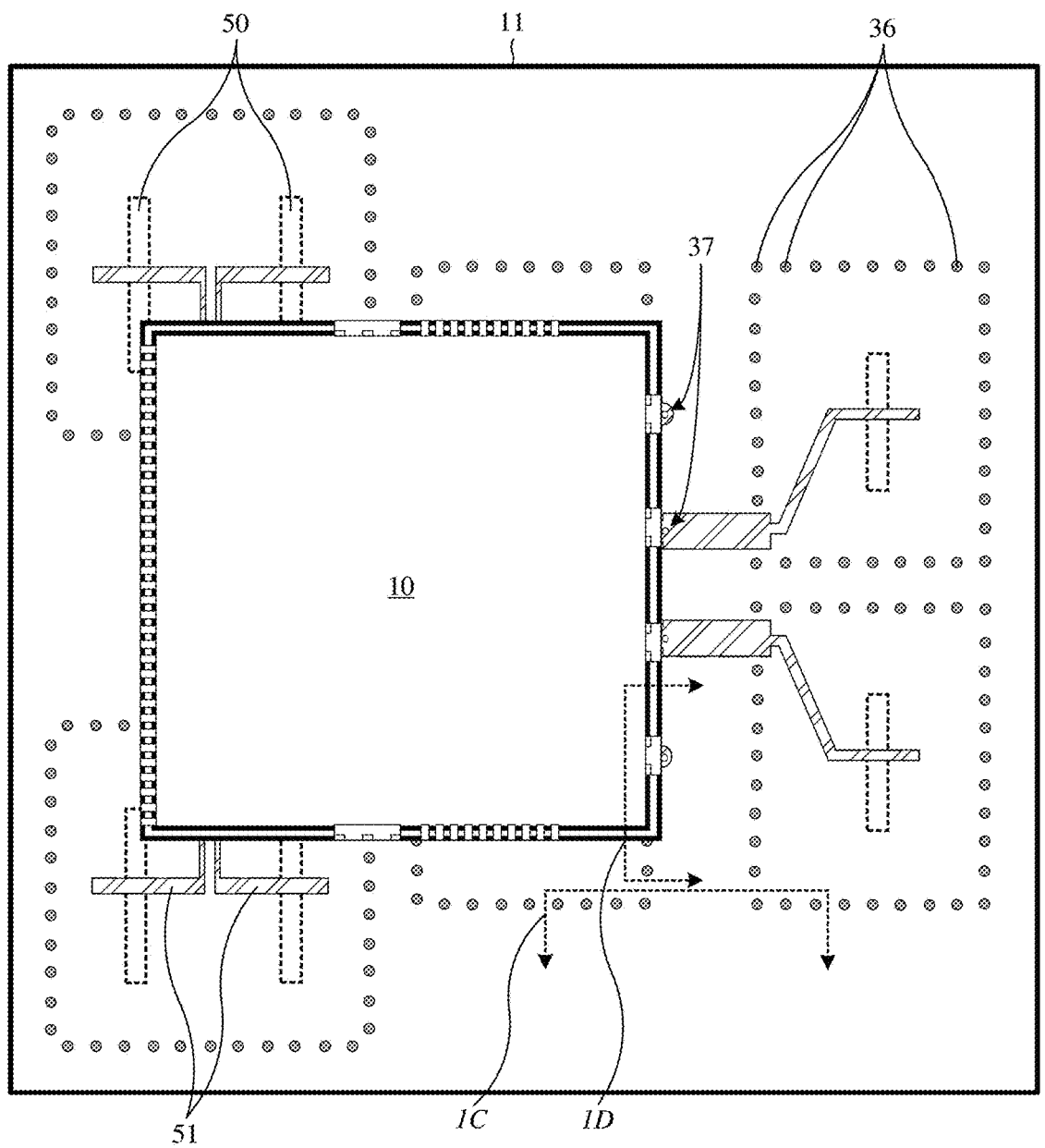
Figure 1C:
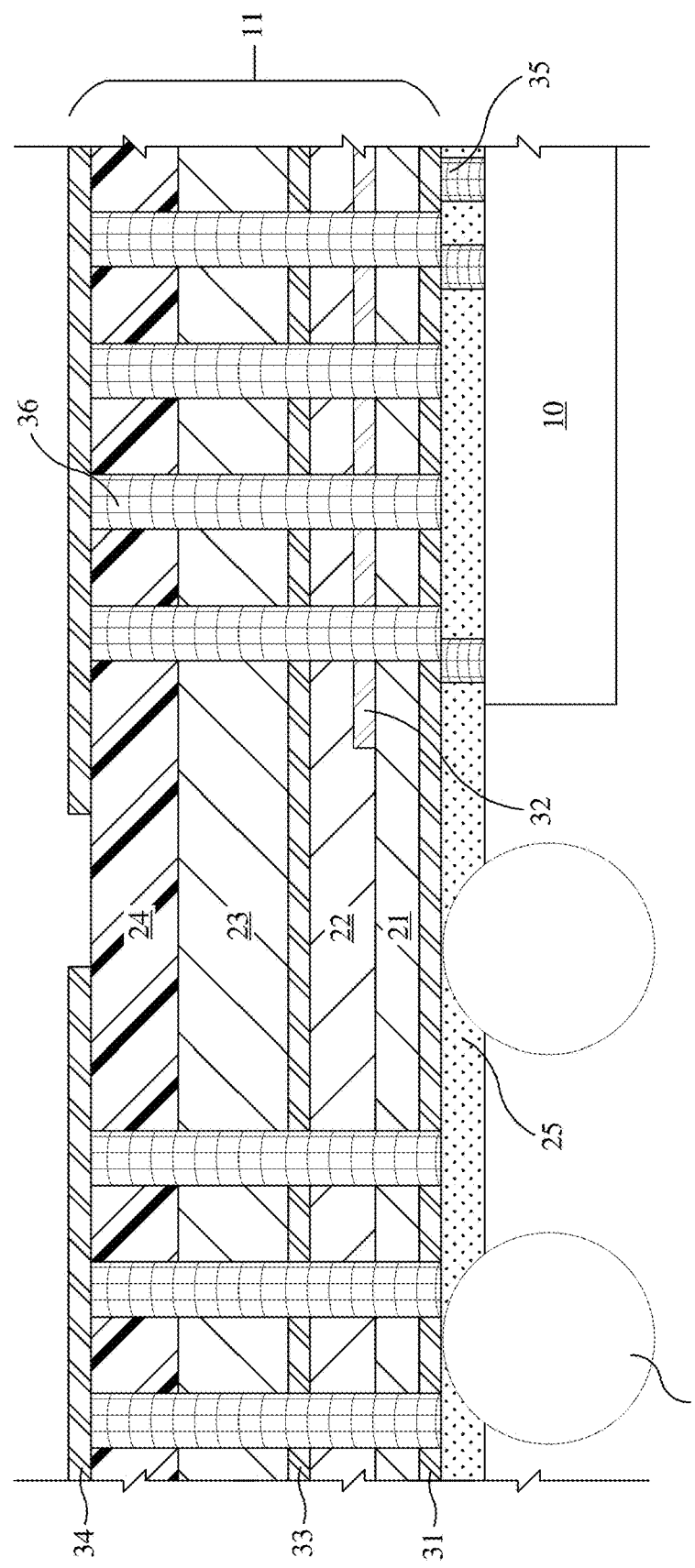
Figure 1D:
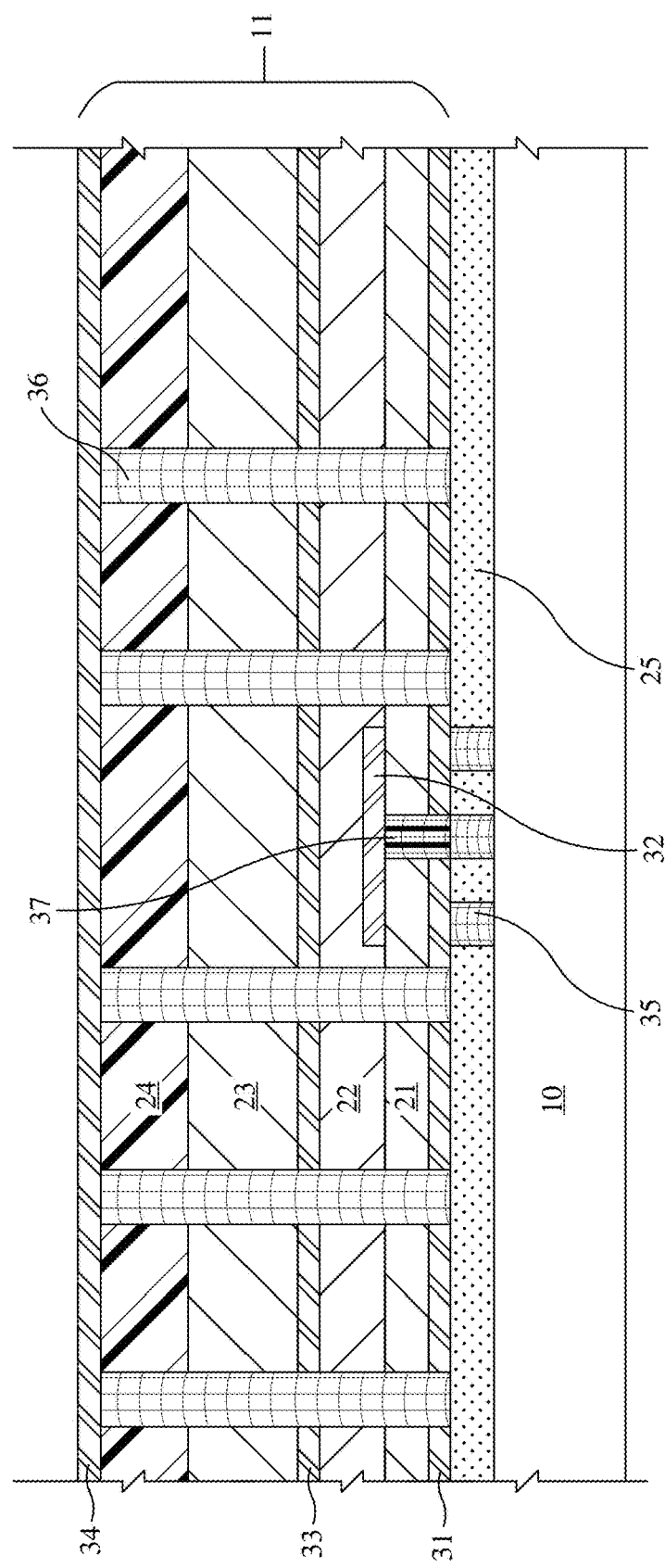

FIGS. 1A-1D illustrate a radio frequency device package including multiple antennas in accordance with an embodiment of the invention where FIG. 1A illustrates a top view of the radio frequency device package, FIG. 1B illustrates a bottom view of the radio frequency device package, and FIGS. 1C and 1D illustrate cross-sectional views of different regions of the radio frequency device package.

Referring to FIG. 1A, multiple antennas 40 of the radio frequency device are disposed on a top surface of the radio frequency device package. Each antenna 40 may be configured to receive and/or transmit radio signals. For example, in various embodiments, some of the antennas 40 may be receiving antennas 41 and some of the antennas 40 may be transmitting antennas 42 as shown in FIG. 1A. In other embodiments, one or more of the antennas 40 may be transceivers configured to both receive and transmit radio signals. The antennas 40 may comprise a conductive material in various embodiments. For example, in one embodiment, the antennas 40 comprise copper (Cu). Antennas made from different conductive materials may be present in the same radio frequency device package in some embodiments.

Dimensions of the antennas 40 may be determined by a desired response to a specific wavelength or grouping of wavelengths (e.g. frequency band). In various embodiments, an antenna sensitive to millimeter wavelength radiation may have a length and width between 1 mm and 2.5 mm. In one embodiment, the length of the antenna is about 1.5 mm and the width of the antenna is about 850 µm. In an alternative embodiment, the length of the antenna is about 1.3 mm and the width of the antenna is about 1.2 mm.

Still referring to FIG. 1A, the antennas 40 may be electromagnetically coupled to transmission lines 51 through openings 50 in a ground plane. The transmission lines 51 may serve to couple the devices on the integrated circuit chip 10 to the antennas 40. The transmission lines 51 may be located in the interior of the radio frequency device package in a 3-dimensional package structure. The transmission lines 51 may be in a microstrip, stripline, coplanar waveguide, or other suitable configuration. The transmission lines 51 may serve to propagate an electromagnetic signal between an antenna 40 and the integrated circuit chip 10. The transmission lines 51 are configured to act as stripline in the embodiment illustrated in FIG. 1A.

The antennas 40 may be vertically aligned with the openings 50. The openings may restrict electromagnetic signals to a defined area such as antennas 40 or transmission lines 51. Electromagnetic signals that are incident on the ground plane may be dissipated by a ground connection. More or fewer openings may also be included in the ground plane and may depend on the number of antennas 40. The size of the openings 50 may depend on the vertical distance between the ground plane and the antennas 40 and may also depend on the size of the antennas 40.

The openings 50 and transmission lines 51 may be disposed in different layers within the radio frequency device. In various embodiments the openings 50 are vertically aligned with portions of the transmission lines 51. The antennas 40 may be electromagnetically coupled to the transmission lines 51 through the openings 50. Alternatively, antennas 40 may also be electrically coupled to transmission lines 51 using vias.

In the case of electrical coupling, radio signals may be transferred between the antennas and the transmission lines by direct electrical conduction. Electrical coupling may also be referred to as direct coupling. For electromagnetic coupling, radio signals may be transferred between the antennas and the transmission lines with electromagnetic radiation. Electromagnetic coupling may also be referred to as indirect coupling. A specific example of electromagnetic coupling between an antenna element and a transmission line uses an opening in a ground plane to direct radiative energy between the transmission line and the antenna element. The opening may be referred to as an aperture and this type of electromagnetic coupling may be referred to as aperture coupling. Antennas and transmission lines that are electromagnetically coupled are typically not electrically coupled.

An antenna may be coupled to more than one transmission line. For example, in one embodiment, the transmitting antennas 42 are configured in a differential antenna configuration in which each transmitting antenna is coupled to two transmission lines. In this configuration, a transmitting antenna may have a gain of 6 dBi and complete matching over a desired bandwidth (57-64 GHz for example). Antenna configurations using multiple antennas may be used for radar applications such as multiple-input, multiple-output (MIMO) imaging and to create virtual antenna channels. Other applications of multiple-antenna configurations may include communication applications that incorporate beam forming.

In various embodiments, each of the antennas 40 may be surrounded or partially surrounded by a conductive barrier 12. The conductive barrier 12 may comprise multiple through vias 36 that form an enclosure or partial enclosure around an antenna 40. The through vias 36 may extend through the antenna substrate 11 as shown in FIGS. 1C and 1D. In various embodiments, the conductive barrier 12 may advantageously electromagnetically and/or electrostatically isolate the antennas 40 from one another. For example, the through vias 36 arranged around a periphery of each antenna may isolate the antennas 40 from each other by acting as a shielding wall to suppress or eliminate the effects of spurious modes, parallel plate modes, and/or higher order modes generated in other transmission lines and antenna elements.

In other embodiments, the size and shape of the conductive barrier 12 may vary. Additionally, in the case of conductive barriers 12 comprising through vias 36, the number of through vias 36 and the spacing of the through vias 36 may be different for different antennas and may vary for a single antenna depending on routing requirements and other design considerations. For example, unequal spacing of adjacent through vias 36 can be seen at element 70. An example of a variation in the shape of an enclosure of through vias 36 arranged around a periphery of an antenna can be seen at element 71 where one contiguous subset of through vias 36 is disposed on a first line and a second contiguous subset of through vias 36 is disposed on a second line, for example, the first line is offset from the second line. The resulting shape of the enclosure of through vias 36 arranged around the periphery of the antenna 40 is irregular.

In this context, irregular may refer to the shape of the enclosure not being a regular polygon. However, irregular may also refer to a variation of any parameter over the extent of an enclosure. For example, an enclosure that has vias with different diameters may be considered an irregular enclosure. Similarly, an enclosure where the spacing of adjacent through vias is varied and/or the spacing of through vias from the antenna is varied may be considered an irregular enclosure. Various irregular enclosures may be required as a result of routing requirements and/or avoiding transmission lines in underlying layers.

A conductive barrier 12 may delineate a region electromagnetically and/or electrostatically isolated from other regions of the radio frequency device package. Such a conductive barrier 12 may be considered a shielding wall. The layout of the radio frequency device package shown in FIGS. 1A-1D and FIG. 2 may be referred to as a shielding wall patch antenna design. In other embodiments, enclosures and partial enclosures around antenna elements may form shielding walls/conductive barriers using other structures such as square vias, rectangular vias, metal lines, metal-filled trenches, and conductive walls.

In various embodiments, conductive barriers 12 around each antenna 40 are sufficiently spaced such that no coupling between the enclosures occurs. Spacing of the enclosures may depend on radiative power of the antennas 40, the material of the antenna substrate 11, and the spacing of through vias 36 among other factors.

Antenna elements may be spaced from one another based on the desired frequency response of the application. However, the radio frequency device package may need to be as small as possible resulting in antenna elements that are near the edges of the package. This integration of multiple antenna elements onto a small substrate may result in fringing fields caused by the edge of the substrate. Fringing fields may undesirably reduce the gain for a given antenna. A possible benefit of the shielding wall patch antenna design using through vias or other conductive structures is to prevent the formation of fringing fields at the edges of the radio frequency device package. Through vias along the periphery of an antenna element may electromagnetically and electrostatically shield the antenna element from the edges of the radio frequency device package as well as other antenna elements. In some embodiments, the through vias may only be located along the edges of the radio frequency device package when coupling between adjacent antenna elements is not an issue, for example.

Referring to FIG. 1B, an integrated circuit chip 10 is disposed on a bottom surface of the radio frequency device package. The integrated circuit chip 10 may be attached to a first conductive layer 31 (shown in FIGS. 1C and 1D) using conductive pillars 35. The integrated circuit chip 10 may be oriented such that the conductive pillars 35 make electrical contact with exposed regions of the first conductive layer 31. In various embodiments, the conductive pillars 35 comprise a conductive material such as copper (Cu) or aluminum (Al). The integrated circuit chip 10 may be attached to the first conductive layer 31 using well-known processes used with surface mount technology (SMT). For example, the integrated circuit chip 10 may be attached using a reflow soldering process during which the radio frequency device package may be subjected to controlled heat.

In various embodiments, the integrated circuit chip 10 includes a semiconductor substrate. In one embodiment, the semiconductor substrate includes silicon. In another embodiment, the semiconductor substrate includes silicon germanium (SiGe). In still another embodiment, the semiconductor substrate includes gallium arsenide (GaAs). In various embodiments the integrated circuit chip 10 has a length and a width between 2.5 mm and 10 mm. In one embodiment, the length and width of the integrated circuit chip 10 are equal and about 4.5 mm.

The integrated circuit chip 10 may include active and passive devices, metal layers, dielectric layers, doped and intrinsic semiconductor regions, and redistribution layers as well as other components known in the art. In various embodiments, the integrated circuit chip 10 has already undergone back end of line (BEOL) processing before being attached to the radio frequency device package.

The integrated circuit chip 10 may contain radio frequency circuitry. In various embodiments, the radio frequency circuitry is designed to operate in a super high frequency (SHF) or an extremely high frequency (EHF) regime. For example, the integrated circuit chip 10 may contain millimeter wave (MMW) circuitry designed to operate in the unlicensed band from 57 GHz to 64 GHz. Additionally or alternatively, the integrated circuit chip 10 may contain circuitry designed to operate in the 28 GHz regime (in 5G applications, for example). The integrated circuit chip 10 may have a receive interface connected to receiving antennas and/or a transmit interface connected to transmitting antennas. In some configurations, a receive interface and a transmit interface may be combined into a single interface. The integrated circuit chip 10 may also include one or more redistribution layers (RDLs) to redistribute connections to allow coupling to the first conductive layer 31.

Additional routing of the transmission lines 51 can be seen in FIG. 1B. The transmission lines 51 may be electrically coupled to the integrated circuit chip 10 using blind vias 37. The transmission lines 51 may be electromagnetically or electrically coupled to antennas 40.

Referring to FIG. 1C, the antenna substrate 11 includes multiple laminate layers and conductive layers. The conductive layers may be patterned to form ground planes, redistributions lines, transmission lines, and the like. In some embodiments, the conductive layers may be formed from a metal foil, metal layer, or metallization that has been laminated to a laminate layer. In one embodiment, the conductive layers comprise copper (Cu). In some embodiments, the conductive layers comprise other conductive materials such as silver (Ag) and aluminum (Al). In some embodiments, the conductive layers may comprise different conductive materials.

The laminate layers may separate the conductive layers and provide structural support for the antenna substrate. In various embodiments, the laminate layers comprise a low-loss high frequency material such as a woven glass reinforced hydrocarbon ceramic and/or polytetrafluoroethylene (PTFE). In some embodiments, the laminate layers comprise a pre-impregnated composite material (PPG). One or more of the laminate layers may be commercial laminate material manufactured with copper cladding on one or both surfaces.

One type of laminate material that may be used to form the conductive layers and laminate layers as described above and in the following is copper clad laminate. Sheets of copper clad laminate material may be fabricated as single-sided or double-sided copper clad sheets. During the fabrication process, copper sheets may be placed on one or both sides of the laminate material. Some combination of heat and pressure may then be applied to facilitate attachment of the copper sheets to the laminate material. It should be noted that in some cases it may be advantageous to use double-sided copper clad laminate material to form the laminate layers discussed previously and in future embodiments even when only a single conductive layer is needed. The unneeded conductive surface on the double-sided copper clad laminate is then etched off prior to lamination to a substrate. A possible benefit of etching a conductive layer off of a laminate material prior to lamination may be to improve adhesion to a substrate.

A conductive layer on a surface of a laminate layer may be an electrodeposited (ED) foil or a rolled foil, for example. A rolled foil sheet may be produced by repeatedly feeding the foil sheet through rollers to evenly reduce the thickness of the foil sheet. ED foil may be more rigid and have a different grain structure. In contrast, rolled foil may be smooth and flexible. In some cases, rolled foil may be advantageous in radio frequency (RF) applications, due to decreased surface roughness.

Still referring to FIG. 1C, the integrated circuit chip 10 is attached to the antenna substrate 11 by way of conductive pillars 35. The conductive pillars 35 may directly attach to the first conductive layer 31 which is disposed on a bottom surface of a first laminate layer 21. The attachment of the integrated circuit chip 10 may also be accomplished using other well-known surface mounting techniques. For example, the conductive pillars 35 may be replaced with solder balls and the integrated circuit chip 10 may be attached using a reflow process.

An underfill layer 25 may be disposed in between the first conductive layer 31 and the integrated circuit chip 10. In various embodiments, the underfill layer is an insulating material. The underfill layer 25 may comprise a polymer material such as a filled epoxy. In some embodiments, the underfill layer 25 is primarily under the integrated circuit chip 10 and does not extend over the entire bottom surface of the antenna substrate 11.

The underfill layer 25 may surround and protect the conductive pillars 35. The underfill layer 25 may reduce strain on the solder joints by bonding the integrate circuit chip 10 to exposed surfaces of the first conductive layer 31 and the first laminate layer 21. Strain on the solder joints may be due to a variety of factors such as size of the integrated circuit chip 10 or increased mismatch of the coefficient of thermal expansion between the integrated circuit chip 10 and the first laminate layer 21. In some cases, the underfill layer 25 may be omitted.

The underfill layer 25 may also advantageously separate the integrated circuit chip 10 from the first conductive layer 31. In the absence of a sufficiently thick underfill layer, transmission lines located on the integrated circuit chip 10 may be affected by the first conductive layer 31. In various embodiments, the thickness of the underfill layer 25 is between 25 μm and 75 μm. In one embodiment, the thickness of the underfill layer 25 is about 45 μm.

The first conductive layer 31 may include a ground plane to reduce or prevent electromagnetic coupling between the integrated circuit chip 10 and subsequent layers disposed over the first conductive layer 31 in some embodiments. Various openings in the ground plane of the first conductive layer 31 may be included to allow for redistribution lines in the first conductive layer 31 that are electrically isolated from the ground plane. In this way, the first conductive layer 31 may function as a redistribution layer (RDL) as well as a ground plane. Alternatively, the first conductive layer 31 may include redistribution lines and the ground plane may be omitted.

Solder balls 30 that make electrical contact with the first conductive layer 31 may be disposed on the underfill layer.

The solder balls 30 may be part of a ball grid array (BGA) for embedded wafer level ball grid array (eWLB) packaging, for example. The solder balls may allow electrical coupling between circuitry on the integrated circuit chip 10 and the antenna substrate 11 such as ground planes, for example.

The first laminate layer 21 comprises a laminate material in some embodiments and is a prepeg material where fibers are pre-impregnated with a thermoplastic or a thermoset resin. In one embodiment, the first laminate layer 21 is GHPL-970LF which is a prepreg material. In alternative embodiments, the first laminate layer 21 may comprise a laminate material used for printed circuit board fabrication. The vertical thickness of the first laminate layer 21 may be between 100 and 300 µm in various embodiments. In one embodiment, the vertical thickness of the first laminate layer 21 is about 200 µm. In other embodiments, the vertical thickness of the first laminate layer 21 is between 50 µm and 150 µm. In one other embodiment, the vertical thickness of the first laminate layer 21 is about 60 µm. The vertical thickness of the first laminate layer 21 may be chosen to optimize transmission line properties in the radio frequency device package.

Again referring to FIG. 1C, a second laminate layer 22 is disposed above the first laminate layer 21. The second laminate layer 22 comprises a laminate material in some embodiments and is also a prepeg material in various embodiments. In one embodiment, the second laminate layer 22 is GHPL-970LF which is a prepreg material. The vertical thickness of the second laminate layer 22 may be similar to that of the first laminate layer 21. The second laminate layer 22 may include a second conductive layer 32 disposed in a bottom region of the second laminate layer 22. In various embodiments, the second laminate layer 22 may be patterned to contain transmission lines 51 (shown in FIGS. 1A and 1B).

A third conductive layer 33 is disposed above the second laminate layer 22. The third conductive layer 33 may comprise a ground plane with openings 50 (shown in FIGS. 1A and 1B) to electromagnetically couple transmission lines 51 in the second conductive layer 32 to antennas disposed at the top surface of the antenna substrate 11. Alternatively, the third conductive layer 33 may be omitted and antennas may be electrically coupled using blind vias that directly connect transmission lines 51 in the second conductive layer 32 to antennas at the top surface of the antenna substrate.

A third laminate layer 23 and a fourth laminate layer 24 are disposed above the third conductive layer 33. In various embodiments, the third laminate layer 23 comprises a laminate material and is also a prepeg material in various embodiments. In one embodiment, the third laminate layer 23 is GHPL-970LF which is a prepreg material. The fourth laminate layer 24 may also be a prepreg material or may be a core material. In one embodiment, the fourth laminate layer 24 is HL972LF which is a core material. In some embodiments, the third laminate layer 23 and the fourth laminate layer 24 are a single layer with substantially the same material composition throughout.

The combined vertical thickness of the third laminate layer 23 and the fourth laminate layer 24 may be between 200 µm and 500 µm in various embodiments. In one embodiment, the combined vertical thickness of the third laminate layer 23 and the fourth laminate layer 24 is about 400 µm. The combined and individual vertical thicknesses of the third laminate layer 23 and the fourth laminate layer 24 may be chosen such that the desired bandwidth of subsequently formed antennas is achieved.

A fourth conductive layer 34 is disposed above the fourth laminate layer 24. The fourth conductive layer 34 may contain one or more antennas 40 (shown in FIG. 1A). Through vias 36 pass through the antenna substrate 11. The through vias 36 comprise a conductive material in various embodiments and are copper (Cu) in one embodiment. The through vias 36 may be connected to ground and may be electrically coupled to ground planes located in one or more of the conductive layers.

In some cases, the through vias 36 may be advantageously inexpensive relative to alternative types of vias (such as blind vias). Costs of the radio frequency device package may be lowered by limiting the use of blind vias in the antenna substrate 11. The through vias 36 may pass through the entire antenna substrate 11 including the first conductive layer 31 and the fourth conductive layer 34.

Referring now to FIG. 1D, a cross-sectional view of a different region of the radio frequency device package includes the integrated circuit chip 10, underfill layer 25, conductive pillars 35, conductive layers, laminate layers, and through vias 36 as previously described. Additionally, a blind via 37 is disposed between two conductive layers such as the first conductive layer 31 and the second conductive layer 32. The blind via 37 may comprise a conductive material in some embodiments and may be copper (Cu) in one embodiment.

A blind via 37 may be used to electrically couple the conductive pillars 35 of the integrated circuit chip 10 to the transmission lines 51 (shown in FIGS. 1A and 1B) located in the second conductive layer 32. This may allow a ground plane in the first conductive layer 31 to shield the integrated circuit chip 10 from the transmission lines 51 while still allowing electrical signals to pass from the integrated circuit chip 10 to the transmission lines 51.

As can be seen in FIGS. 1A-1D, antennas 40 in the fourth conductive layer 34 ground planes in the first conductive layer 31, third conductive layer 33, and fourth conductive layer 34 may at least partially overlap the integrated circuit chip 10 within the radio frequency device package. Some or all of the antennas and ground planes may be located directly over the integrated circuit chip 10 in some embodiments. A possible benefit of this complete integration of the antenna elements into the packaging of the integrated circuit chip 10 is to reduce the overall size of the package. For example, a fully functional radio frequency device with multiple antenna elements may be incorporated into a very small package. In one embodiment, the radio frequency device package is 9 mm by 9 mm, for example. In other embodiments, the radio frequency device package may be made smaller or larger dependent on design considerations such as frequency response and the number of antenna elements.

It should be noted when comparing features of FIGS. 1A-1D that the laminate layers are not shown in FIGS. 1A and 1B for reasons of clarity. Additionally, to allow visibility of the transmission lines 51, the first conductive layer 31 is not shown and only the openings 50 in the third conductive layer 33 are shown in FIGS. 1A and 1B.

Figure 2:
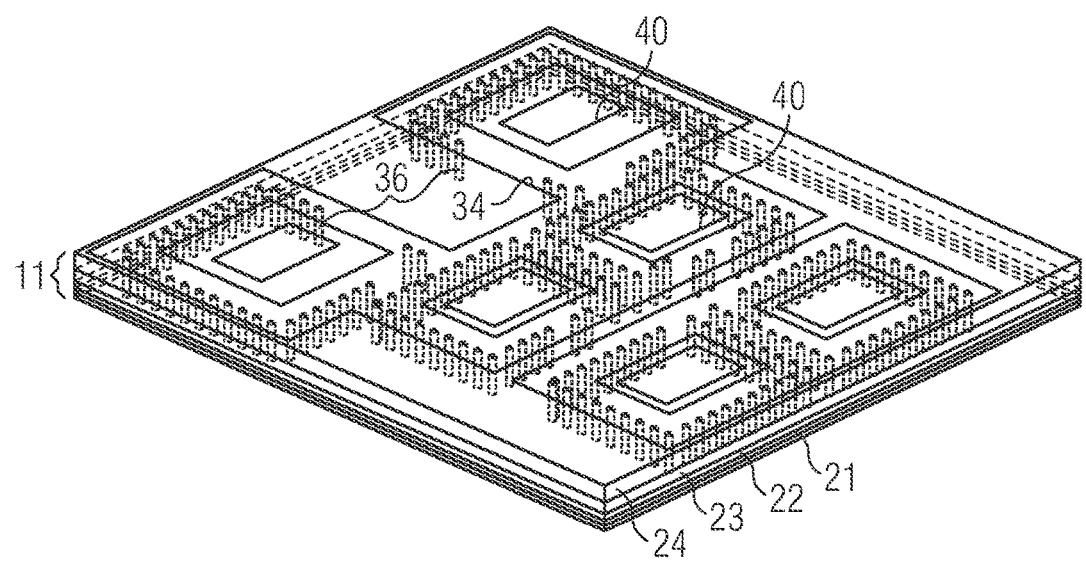
FIG. 2 illustrates a three-dimensional view of a radio frequency device package in accordance with an embodiment of the invention.

FIG. 2 illustrates a three-dimensional view of a radio frequency device package in accordance with an embodiment of the invention.

Referring to FIG. 2, a three-dimensional view of the radio frequency device package illustrated in FIGS. 1A-1D is shown to further describe the relative placement of the features in the radio frequency device package. For example, the top surface of the antenna substrate 11 is visible and includes the first, second, third, and fourth laminate layers 21, 22, 23, and 24 and the antennas 40 as well as the fourth conductive layer 34 and the through vias 36 enclosing the individual antennas. Transmission lines and ground planes are not shown in FIG. 2 for reasons of clarity.

The antenna substrate 11 may include additional conductive, dielectric, or packaging elements that have not been described. Additionally, the radio frequency device package is not limited to two transmitting antennas and four receiving antennas as illustrated in FIGS. 1A, 1B, and 2. Any number of transmitting and receiving antennas may be incorporated into the radio frequency device package as needed. Additionally, any individual antenna may be used as both a transmitter and receiver (transceiver) in a radio frequency device package. Other optimization and design features such as different antenna types, antenna feedings, transmission lines, additional antenna layers, and cavities may be present in other embodiment radio frequency design packages as well as other features well-known in the art as required for specific applications and to produce desired functionality.

In various embodiments, the radio frequency device package may also include additional packaging material around the integrated circuit chip and the antenna substrate. For example, a plastic, epoxy, resin, or other suitable material may be used to encapsulate the integrated circuit chip on the bottom of the radio frequency device package. In some embodiments, the integrated circuit chip may be enclosed on all sides. Alternatively, a surface of the integrated circuit chip (the surface opposite the conductive pillars, for example) may be left exposed. The exposed surface of the integrated circuit chip may contain additional external connections.

The exposed areas of the integrated circuit chip and the antenna substrate at the bottom of the radio frequency device package may include solder balls such as in a ball grid array (BGA) for subsequent attachment to an external support such as a printed circuit board (PCB). The solder balls may be contained in the additional packaging material enclosing the integrated circuit chip or may be exposed.

Solder balls in a BGA may be used to electrically couple the first conductive layer and/or the integrated circuit chip to circuitry located on a PCB, for example. In some embodiments, all connections of the integrated circuit chip are located on the surface of the chip containing the conductive pillars. In this case, all connections of the chip are directly coupled to redistribution lines in the first conductive layer and the redistribution lines are directly coupled to the solder balls and the PCB. In other embodiments, connections of the integrated circuit chip are located on both major surfaces of the chip and some solder balls are directly coupled to connections on the chip while others are coupled to redistribution lines in the first conductive layer. Other elements such as laser drilled vias may also be used to connect the radio frequency device package to circuitry on a PCB.

The BGA may also provide vertical separation between a PCB or other external support and the integrated circuit chip 10 so that the integrated circuit chip 10 is protected. In this way contact between the integrated circuit chip 10 and the PCB or other substrate may be prevented. Alternatively, the integrated circuit chip may be protected by additional packaging or may be directly connected to the PCB or other substrate using solder balls.

This radio frequency device package described in previous and future embodiments may have benefits such as reduced overall package size and simplified manufacturing processes compared to conventional embedded wafer level ball grid array (eWLB) packages and advanced thin small leadless packages (ATSLP). Additionally, the radio frequency device may have improved performance because of the electromagnetic and electrostatic isolation afforded by the enclosure of through vias around each antenna.

Figure 3A:
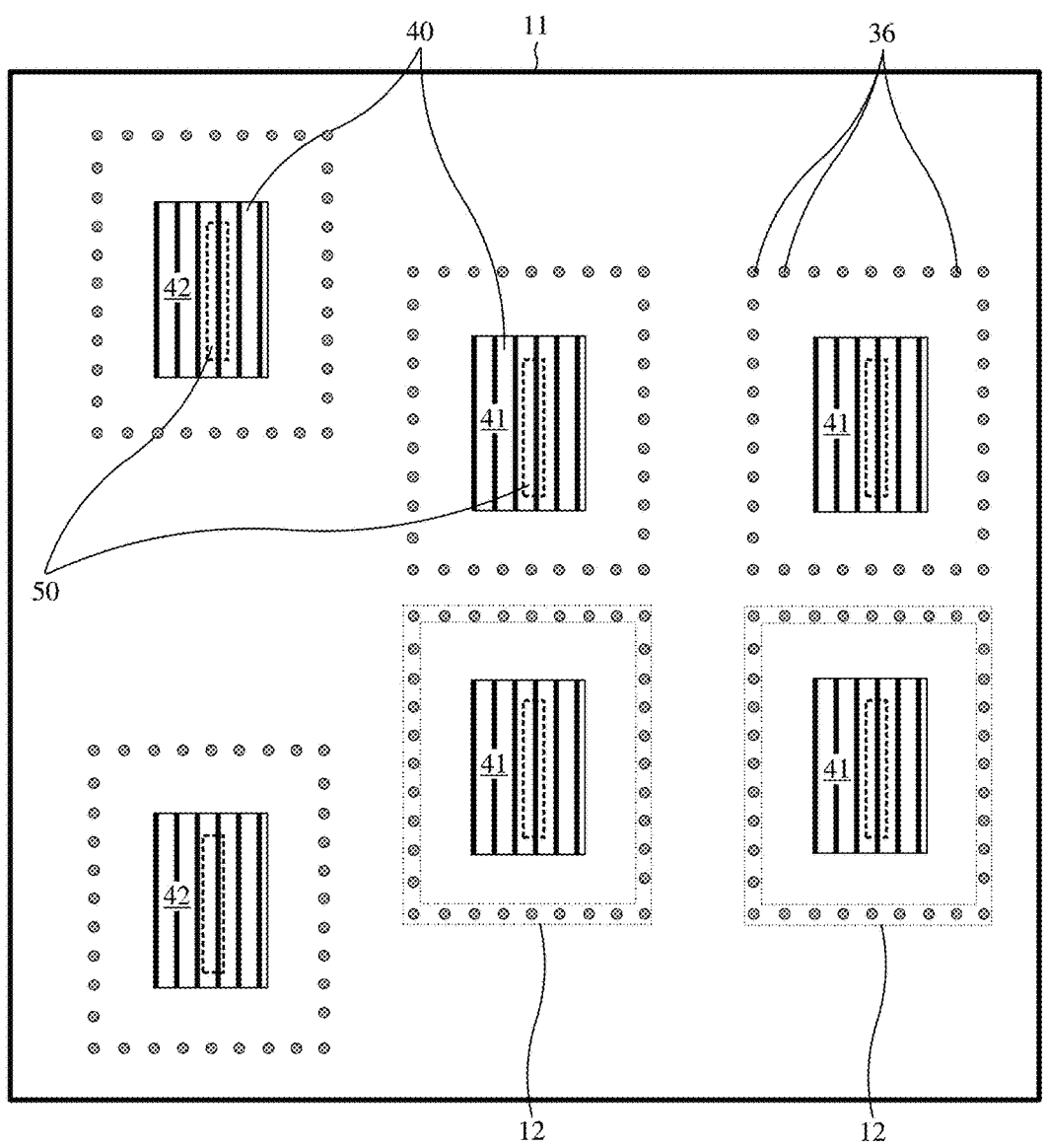
Figure 3B:
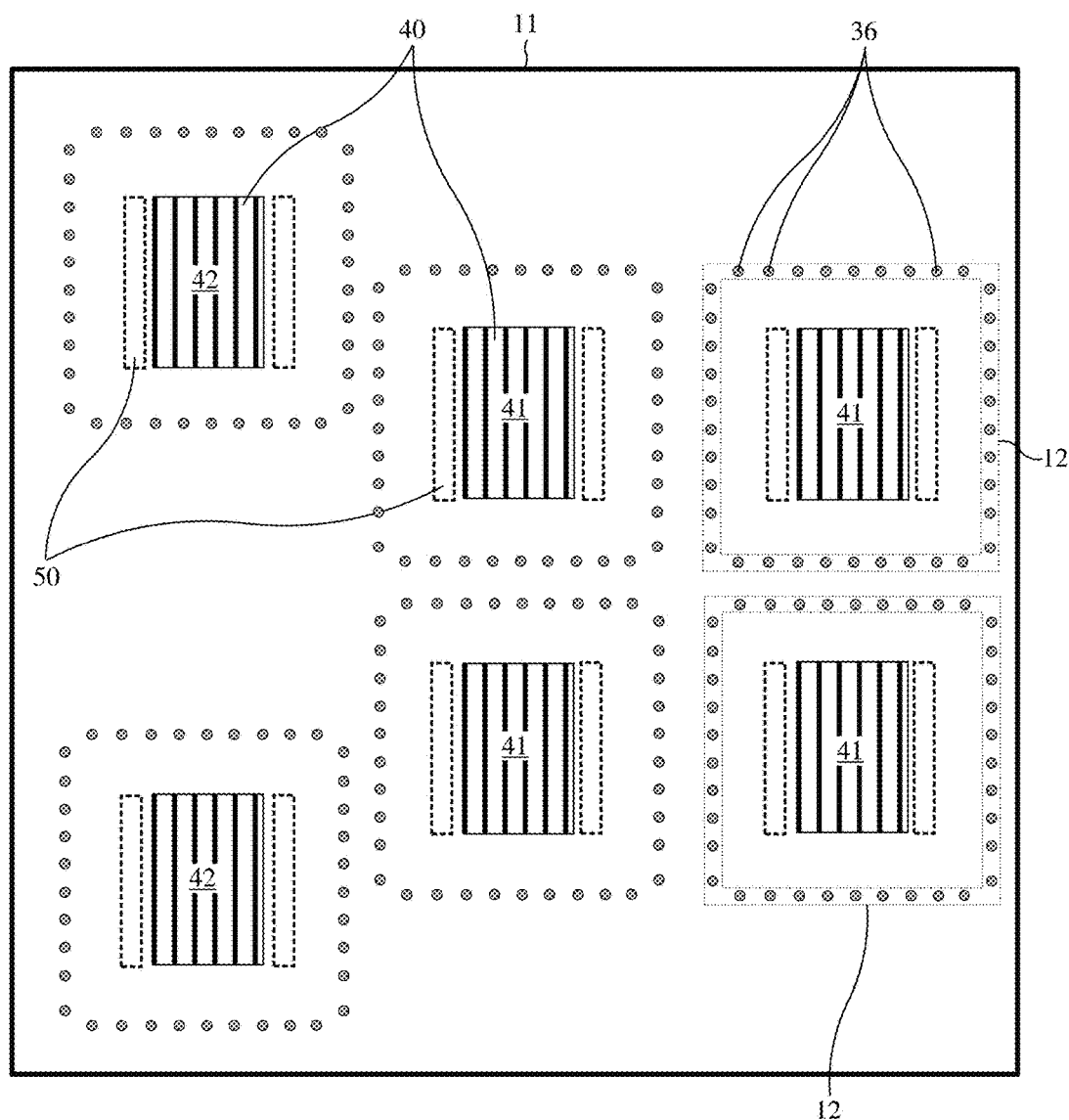

FIGS. 3A and 3B illustrate top views of schematic layouts of radio frequency device packages in accordance with embodiments of the invention where FIG. 3A illustrates a top view of a schematic layout of a radio frequency device package including single-ended patch antennas and FIG. 3B illustrates a top view of a schematic layout of a radio frequency device package including differential patch antennas.

FIG. 3A shows a top view of an example antenna layout similar to the radio frequency device package illustrated in FIGS. 1A-1D and FIG. 2 except all six antennas are single-ended antennas. A single-ended antenna is coupled to only one transmission line using a single opening vertically aligned with the antenna.

Referring to FIG. 3A, the antenna substrate 11 includes six antennas 40 and six openings 50. A conductive barrier 12 comprising through vias 36 is arranged around a periphery of each antenna and opening to provide isolation between antennas 40. In this embodiment, two antennas 40 are transmitting antennas 42 and four antennas 40 are receiving antennas 41. Other embodiments may include different numbers of antennas and each antenna may be configured to transmit and/or receive signals depending on specific functional requirements of the radio frequency device.

FIG. 3B shows a top view of an example antenna layout similar to the radio frequency device package illustrated in FIGS. 1A-1D and FIG. 2 except all six antennas are differential antennas. A differential antenna is coupled to two or more transmission lines using multiple openings beneath, but not necessarily vertically aligned with the antenna.

Referring to FIG. 3B, the antenna substrate includes six antennas 40 and twelve openings 50. A conductive barrier 12 comprising through vias 36 surrounds each antenna and corresponding pair of openings to provide isolation between antennas 40. As previously described in reference to FIG. 3A, the number of antennas and designation of antennas as receivers, transmitters, or transceivers depends on the specific functional requirements of the radio frequency device.

Figure 4:
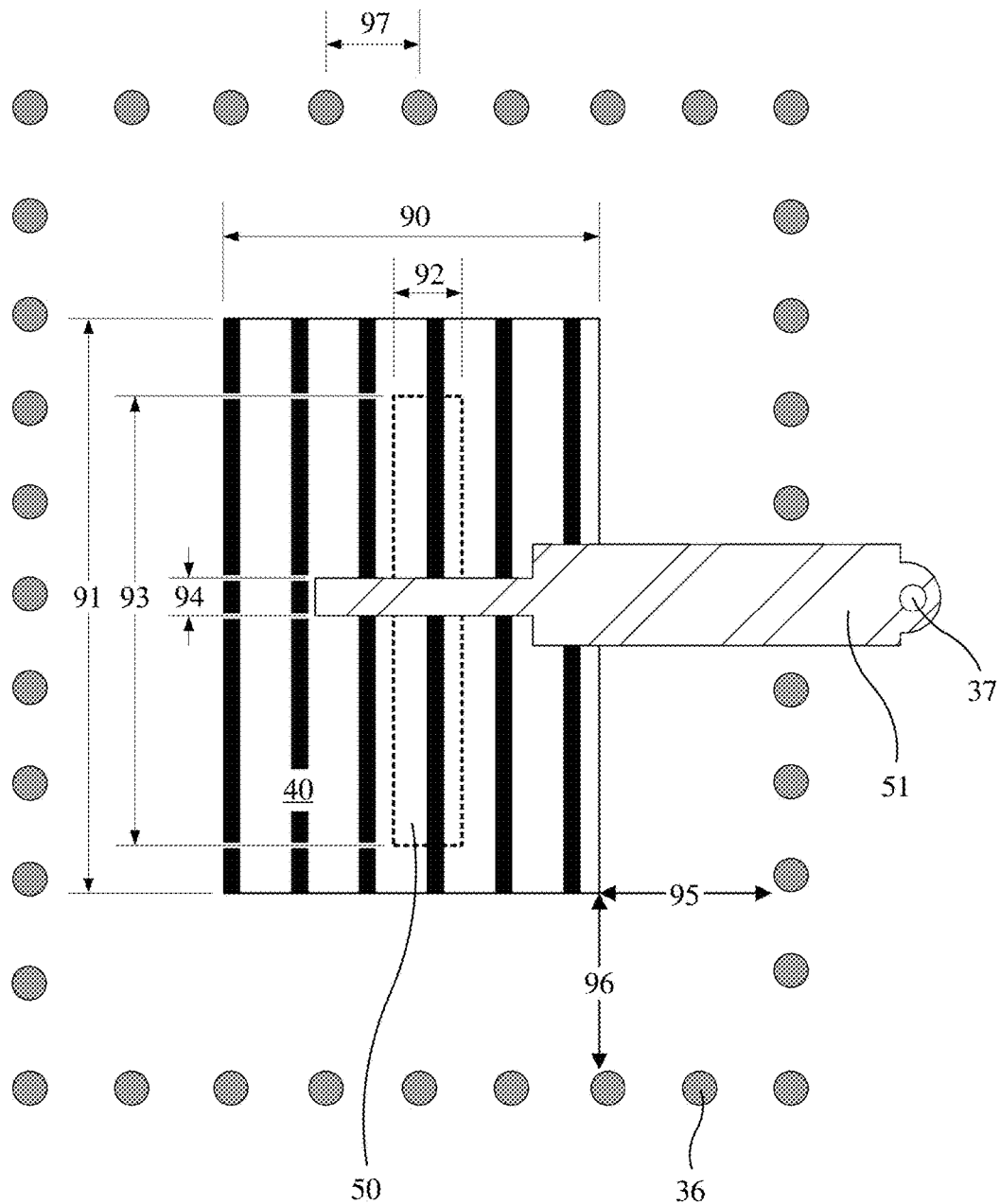
FIG. 4 illustrates a bottom view of an antenna in accordance with embodiments of the invention.

FIG. 4 illustrates a bottom view of an antenna in accordance with embodiments of the invention.

Referring to FIG. 4, an antenna 40 is disposed above an opening 50 and a transmission line 51. The transmission line 51 may be coupled to another layer using a blind via 37. The antenna 40 and opening 50 are enclosed by a pattern of through vias 36. In various embodiments, some or all of the through vias 36 may be electrically coupled to a ground connection and/or ground planes within a radio frequency package device.

In this embodiment, the antenna 40 is a singled-ended electromagnetically coupled patch antenna, but other shapes and types of antenna are also possible. The antenna 40 has a patch width 90 and a patch length 91. In various embodiments, the patch width 90 is between 500 µm and 1500 µm. In one embodiment, the patch width 90 is about 850 µm. In various embodiments, the patch length 91 is between 1000 µm and 2000 µm. In one embodiment, the patch length 91 is about 1500

The opening 50 has an opening width 92 and an opening length 93. In various embodiments, the opening width 92 is between 100 µm and 200 µm. In one embodiment, the opening width 92 is about 150 µm. In various embodiments, the opening length 93 is between 1000 µm and 1500 µm. In one embodiment, the opening length 93 is about 1200 µm.

The transmission line 51 has a transmission line width 94. In various embodiments, the transmission line width 94 is between 50 μm and 150 μm. In one embodiment, the transmission line width 94 is about 90 μm.

In this embodiment, the arrangement of the through vias 36 is the same shape as the antenna 40, but other shapes including irregular shapes (as illustrated in FIGS. 1A and 1B) are possible. The through vias 36 are spaced from the edges of the antenna 40 by a first through via buffer 95 and a second through via buffer 96. In this embodiment, buffers between the edges of the antenna 40 and the through vias 36 are equal on opposing sides of the antenna 40, but they can be different. Additionally, the first through via buffer 95 and the second through via buffer 96 may be the same or different. In various embodiments, through via buffers are between 100 μm and 500 μm. In one embodiment, through via buffers are about 250 μm.

The through vias 36 are spaced from adjacent through vias 36 by a through via spacing 97. In this embodiment, the through via spacing 97 is uniform across the pattern of through vias, but non-uniform spacing of through vias is also possible. In various embodiments, the through via spacing 97 is below the wavelength of the transmitted/received signals divided by eight ($\lambda/8$). In other embodiments, the through via spacing 97 is kept below $\lambda/10$. For example, at 60 GHz, the wavelength $\lambda$ is 5 mm so $\lambda/8=625$ μm and $\lambda/10=500$ μm.

The effectiveness of the isolation properties of the enclosure or partial enclosure formed by the through vias 36 may be improved by decreasing the through via spacing 97. As a result, the through via spacing in many embodiments, is much lower than $\lambda/10$ when possible. In various embodiments, the through via spacing 97 is between 50 μm and 500 μm. In one embodiment, the through via spacing 97 is about 200 μm. An analogy may be the spacing of conductive surfaces in a Faraday cage. However, in contrast to a Faraday cage which usually prevents radiation from entering of exit the cage in all directions, the enclosure or partial enclosure formed by the through vias may allow for radiation to propagate in at least the direction normal to the top surface of the radio frequency device package.

In various embodiments, the diameter of the through vias 36 is between 100 μm to 250 μm. In one embodiment, the diameter of the through vias 36 is about 150 μm. In another embodiment, the diameter of the through vias 36 is about 100 μm. Through via diameter may vary from enclosure to enclosure and also within a single enclosure in some cases. The diameter of the through vias 36 may be influenced by manufacturing considerations and capabilities as well as the composition of the antenna substrate stack.

Figure 5B:
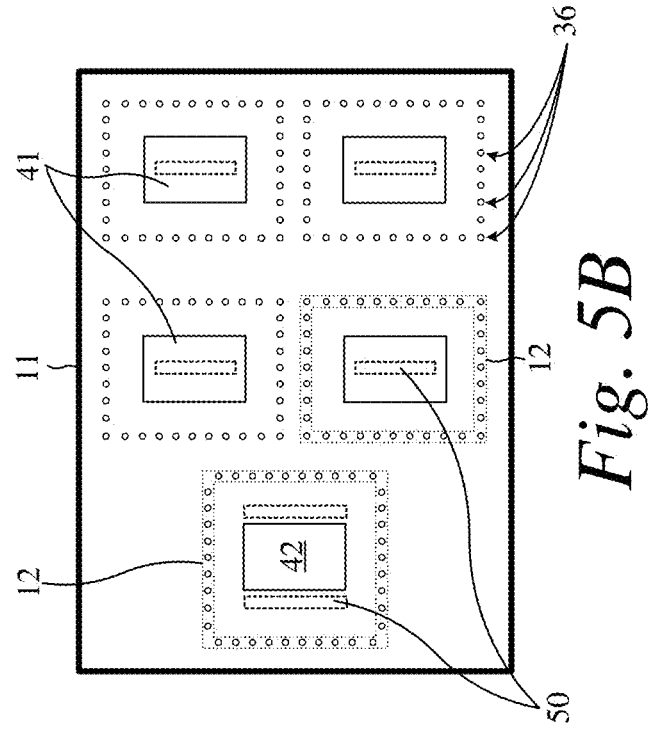
Figure 5A:
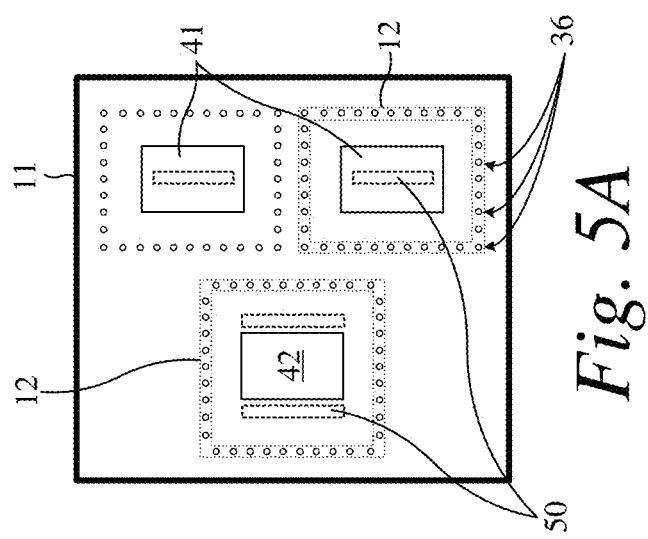
Figure 5D:
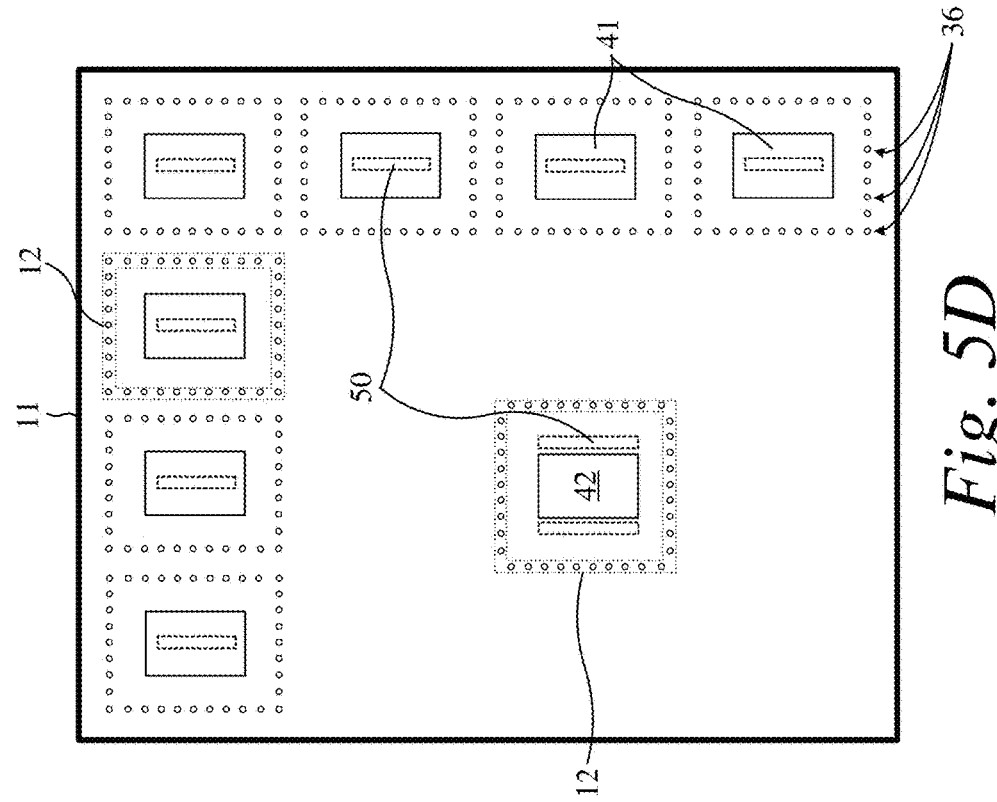
Figure 5C:
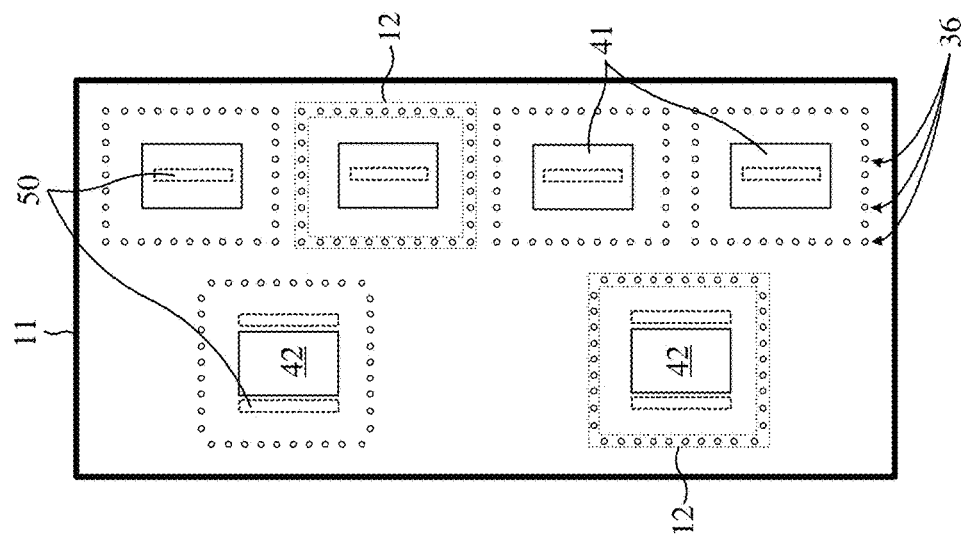
Figure 5G:
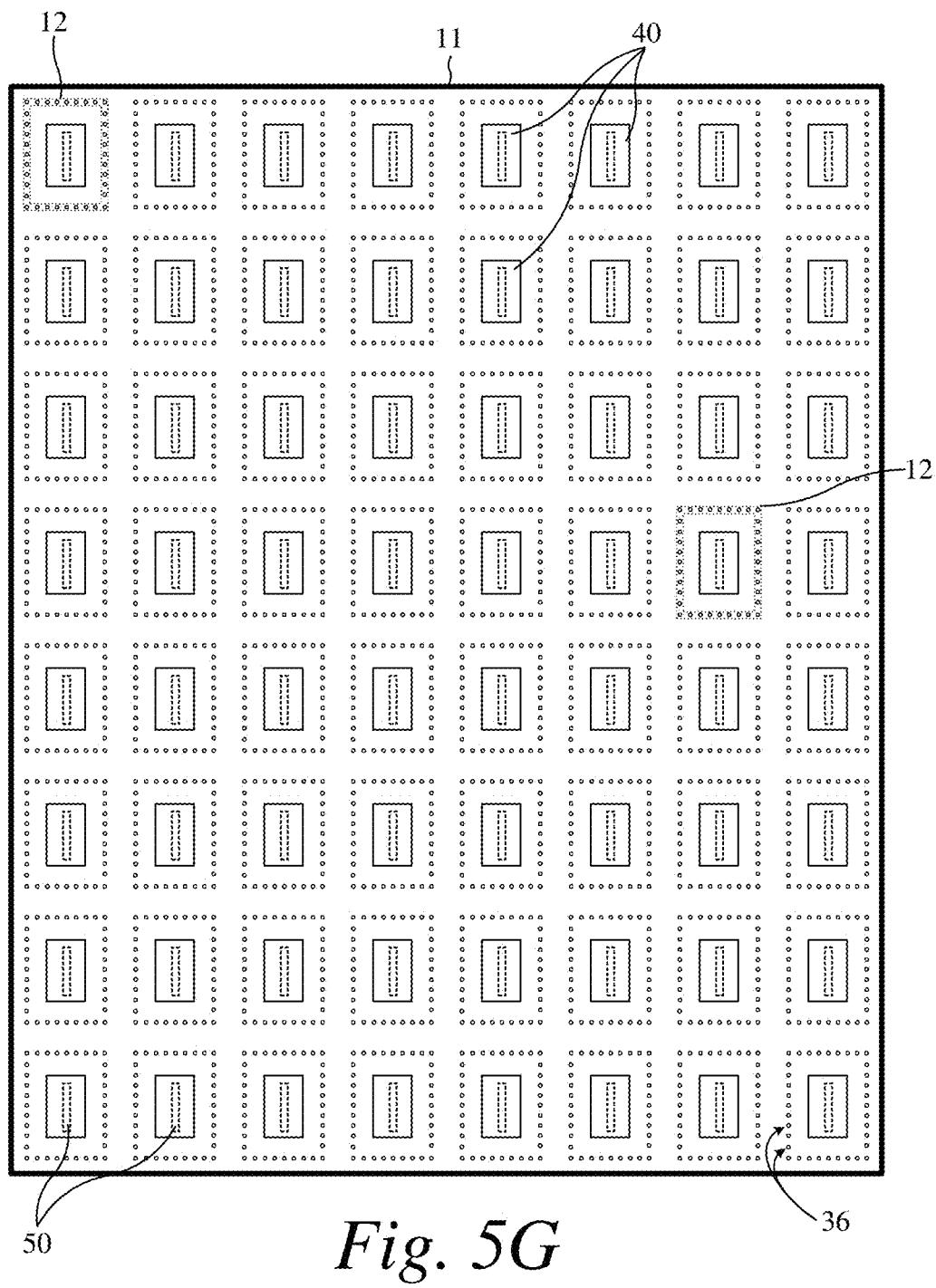

FIGS. 5A-5G illustrate top views of schematic layouts of radio frequency device packages in accordance with embodiments of the invention where FIG. 5A illustrates a top view of a schematic layout of a radio frequency device package including one transmitter and two receivers, FIG. 5B illustrates a top view of a schematic layout of a radio frequency device package including one transmitter and four receivers, FIG. 5C illustrates a top view of a schematic layout of a radio frequency device package including two transmitters and four receivers, FIG. 5D illustrates a top view of a schematic layout of a radio frequency device package including one transmitter and seven receivers, FIG. 5E illustrates a top view of a schematic layout of a radio frequency device package including a four by four array of single-ended patch antennas, FIG. 5F illustrates a top view of a schematic layout of a radio frequency device package including a four by four array of differential patch antennas, and FIG. 5G illustrates a top view of a schematic layout of a radio frequency device package including an eight by eight array of antenna elements.

Referring to FIG. 5A, an embodiment radio frequency device package includes an antenna substrate 11 comprising one transmitting antenna 42 in a differential configuration and two receiving antennas 41 in a single-ended configuration isolated from each other using conductive barriers 12 comprising through vias 36. Corresponding openings 50 are also included in the antenna substrate 11.

Referring to FIG. 5B, an embodiment radio frequency device package includes one transmitting antenna 42 configured as a differential antenna and four receiving antennas 41 configured as single-ended antennas. Additional elements are as previously described.

Referring to FIG. 5C, an embodiment radio frequency device package includes two transmitting antennas 42 configured as a differential antenna and four receiving antennas 41 configured as single-ended antennas. Additional elements are as previously described.

Referring to FIG. 5D, an embodiment radio frequency device package includes one transmitting antenna 42 configured as a differential antenna and seven receiving antennas 41 configured as single-ended antennas. Additional elements are as previously described.

FIGS. 5E, 5F, and 5G illustrate schematic layouts of radio frequency device packages for applications requiring a large array of antenna elements such as 5G applications, for example.

Referring to FIG. 5E, an embodiment radio frequency device package includes 16 receiving antennas 41 in a single-ended configuration arranged in a four by four grid. Additional elements are as previously described.

Referring to FIG. 5F, an embodiment radio frequency device package includes 16 transmitting antennas 42 configured as differential antennas arranged in a four by four grid. Additional elements are as previously described. Although FIG. 5E and FIG. 5F illustrate arrays of identical antenna elements, some applications may require different antenna sizes and types in the same array and/or integrated in the same radio frequency device package. Arrays of 16 antennas are common for beam forming applications such as in 5G communications at 28 GHz, for example.

Referring to FIG. 5G, an embodiment radio frequency device package includes 64 antennas 40. In one embodiment, all of the antennas 40 are configured as single-ended antennas. In other embodiments, all or some of the antennas may be configured as differential antennas or any other conceivable configuration known in the art. In beam forming applications, the increased number of antennas may allow increased directional control among other benefits. Additional elements are as previously described.

It should be noted that singled-ended antennas and differential antennas may be configured to transmit, receive, or transmit and receive radio signals in the large array antenna layouts such as those illustrated in FIGS. 5E-5G as well as in all other embodiments presented herein. For example, the single-ended antenna array illustrated in FIG. 5E may also be configured as a transmitting antenna array or as a transmitting and receiving antenna (transceiver) array depending on the application. Similarly, the differential antenna array shown in FIG. 5F may also be configured as a receiving antenna array or a transceiver array. Antennas may further be configured to operate in time division duplex (TDD) mode, frequency division duplex (FDD) mode, or both. As with other embodiments, individual antenna elements within the layout may be of a different type, size, shape, or configuration relative to other antenna elements.

Figure 6A:
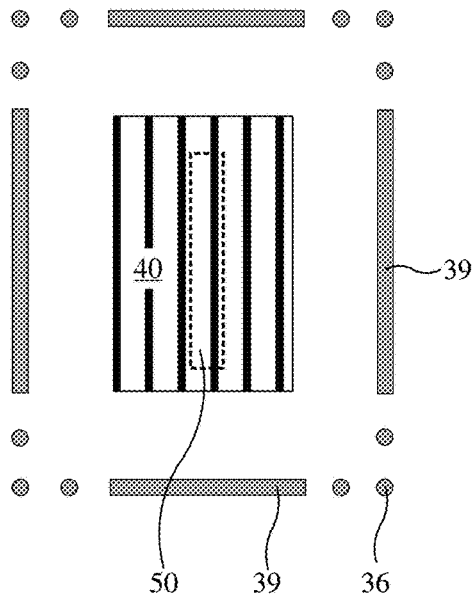
Figure 6B:
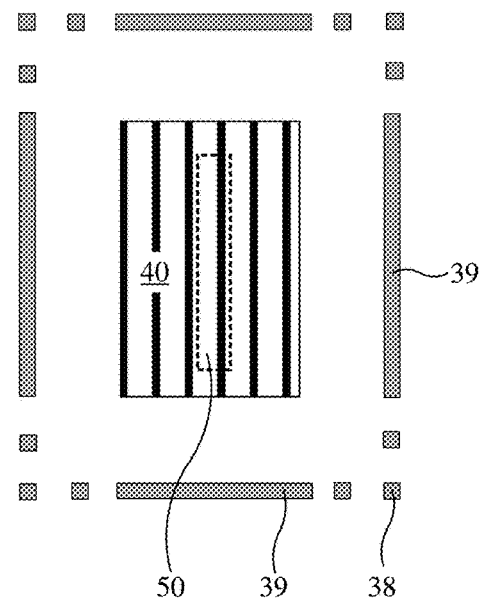
Figure 6C:
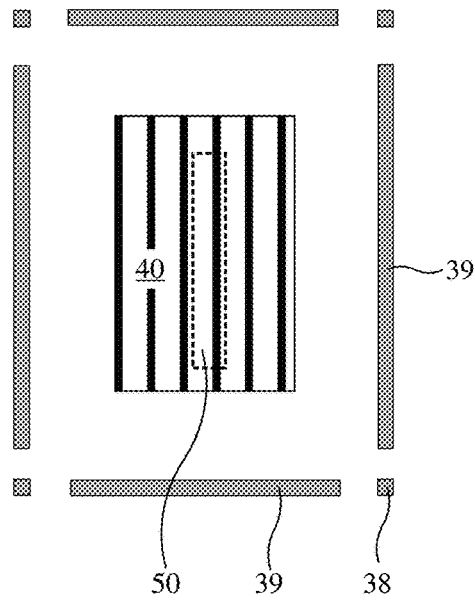
Figure 6D:
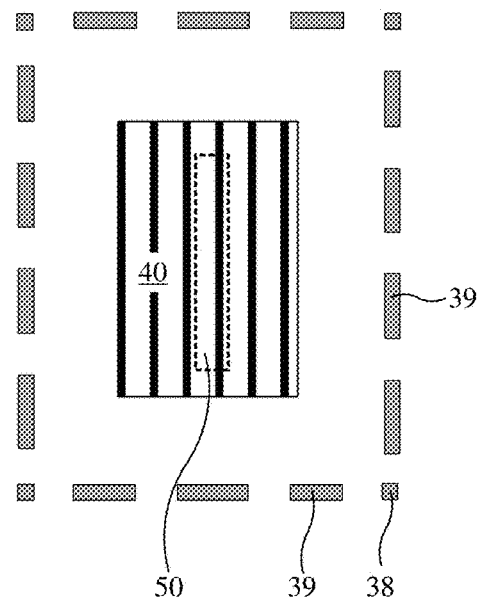

FIGS. 6A-6D illustrate top views of antennas in accordance with additional embodiments of the invention, where FIG. 6A illustrates a top view of an antenna including through vias and rectangular through vias, FIG. 6B illustrates a top view of an antenna including square through vias and rectangular through vias, FIG. 6C illustrates a top view of an antenna including square through vias and conductive walls, and FIG. 6D illustrates a top view of an antenna including square through vias and rectangular through vias.

Referring to FIG. 6A, an antenna 40 is shown surrounded by through vias 36 and rectangular through vias 39. The rectangular through vias 39 may be similar to the through vias 36 except that the rectangular through vias 39 may have a rectangular cross-section. The through vias 36 and rectangular through vias 39 may form a conductive barrier that isolates the antenna 40 from the edges of the antenna substrate and other elements of the antenna substrate as previously described.

Referring to FIG. 6B, an antenna 40 is shown surrounded by square through vias 38 and rectangular through vias 39. The square through vias 38 may be similar to through vias 36 except that the square through vias 38 may have a square cross-section. The square through vias 38 and the rectangular through vias 39 may form a conductive barrier as previously described.

Referring to FIG. 6C, an antenna 40 is shown surrounded by square through vias 38 and rectangular through vias 39. In various embodiments, the rectangular through vias 39 may have a major dimension that is larger than a major dimension of the antenna 40. In some cases the rectangular through vias 38 may be referred to as conductive walls. The square through vias 38 and the rectangular through vias 39 may form a conductive barrier as previously described.

Referring to FIG. 6D, an antenna 40 is shown surrounded by square through vias 38 and rectangular through vias 39. In various embodiments, multiple rectangular through vias 39 are on a single side of the antenna 40. The square through vias 38 and the rectangular through vias 39 may form a conductive barrier as previously described.

In various embodiments, some or all of the through vias, square through vias, and rectangular through vias described previously may be implemented as blind or buried vias. Any combination of through vias, square through vias, rectangular through vias, and conductive walls may be incorporated to form a partial or complete conductive barrier around a given antenna in an embodiment radio frequency device package. For example, routing requirements may require unevenly spaced through vias on a first side of the antenna whereas a conductive wall may be used on a second side of the antenna. Similarly, the size of the components in the conductive barrier may vary. The shape of the enclosure formed by the conductive barrier is also not limited. For example, in some cases a circle or ellipse may be used. Additionally, an irregular shape may be used such as previously described in reference to FIGS. 1A and 1B.

Figure 7:
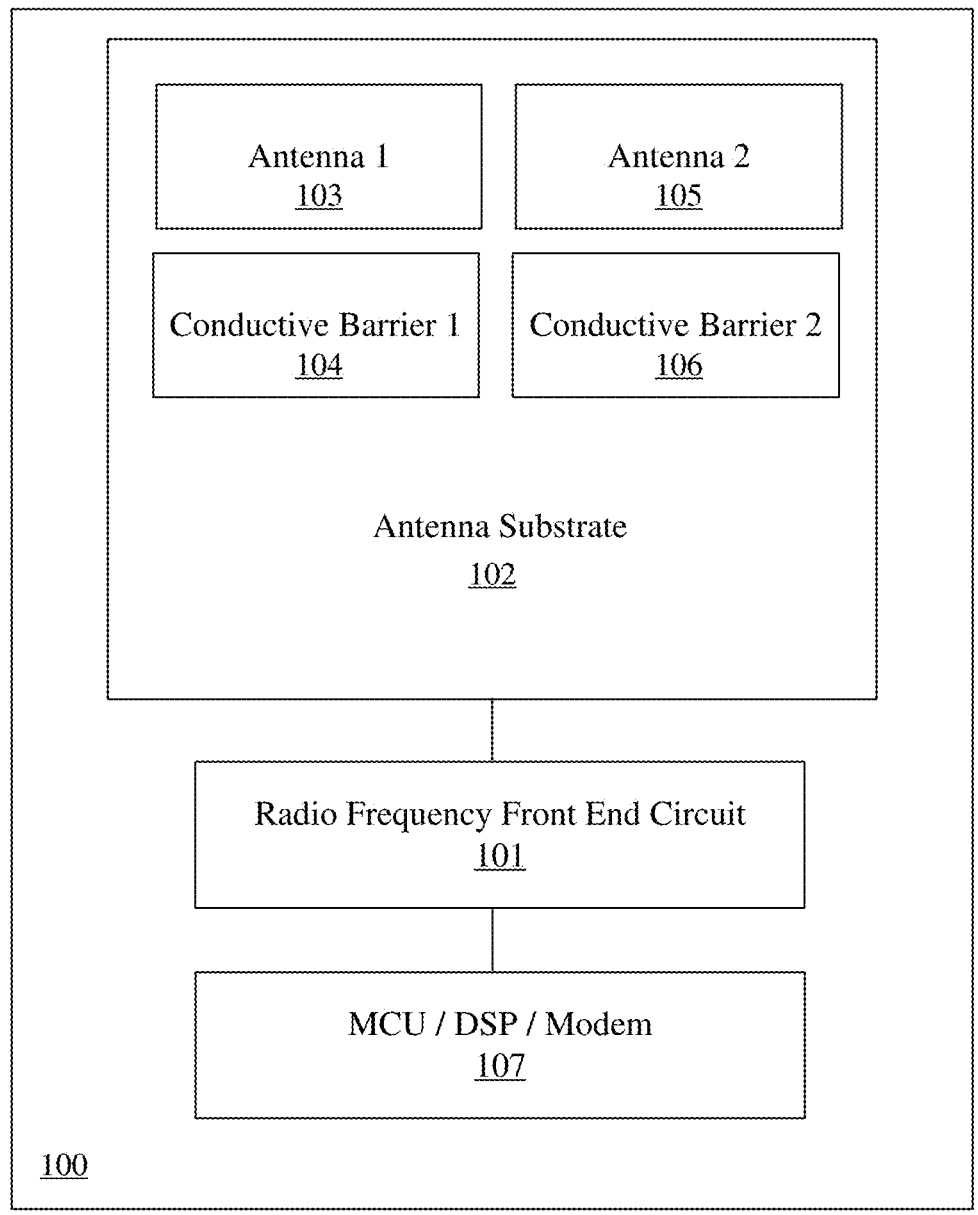
FIG. 7 illustrates a functional block diagram of a semiconductor device package including a radio frequency front end circuit and one or more antennas in accordance with an embodiment of the invention.

FIG. 7 illustrates a functional block diagram of a semiconductor device package including a radio frequency front end circuit and one or more antennas.

Referring to FIG. 7, a semiconductor device package 100 includes a radio frequency front end circuit 101 configured to process radio frequency signals. The semiconductor device package 100 includes a first antenna 103 configured to transmit/receive a first radio frequency signal. The semiconductor device package 100 includes an antenna substrate 102 including the first antenna 103. The antenna substrate 102 is configured to transfer the first radio frequency signal between the radio frequency front end circuit 101 and the first antenna 103. The antenna substrate 102 includes a first conductive barrier 104 configured to electromagnetically and electrostatically isolate the first antenna 103. In one embodiment, the first radio signal comprises a frequency between 55 GHz and 65 GHz. In one embodiment, the gain of the first antenna is about 6 dBi.

In various embodiments, the semiconductor device package 100 may also include a second antenna 105 and a second conductive barrier 106. The second antenna 105 may be configured to transmit/receive a second radio frequency signal. The second conductive barrier 106 may be configured to electromagnetically and electrostatically isolate the second antenna 105. The antenna substrate 102 may include the second antenna 105. The second antenna 105 may be configured to transfer the second radio frequency signal between the radio frequency front end circuit 101 and the second antenna 105. In some embodiments, the first antenna 103 is a receiver antenna and the second antenna 105 is a transmitter antenna.

In various embodiments, the semiconductor device package 100 may also include additional circuitry 107 such as a microcontroller unit (MCU), a digital signal processor (DSP), and/or a modem.

All features illustrated in FIG. 7 may be implemented as described in previous embodiments. Additionally, the semiconductor device package is not limited to containing only the features shown in FIG. 7. Any number of additional elements may be incorporated such as antenna, circuit, substrate, and package elements.

Figure 8:
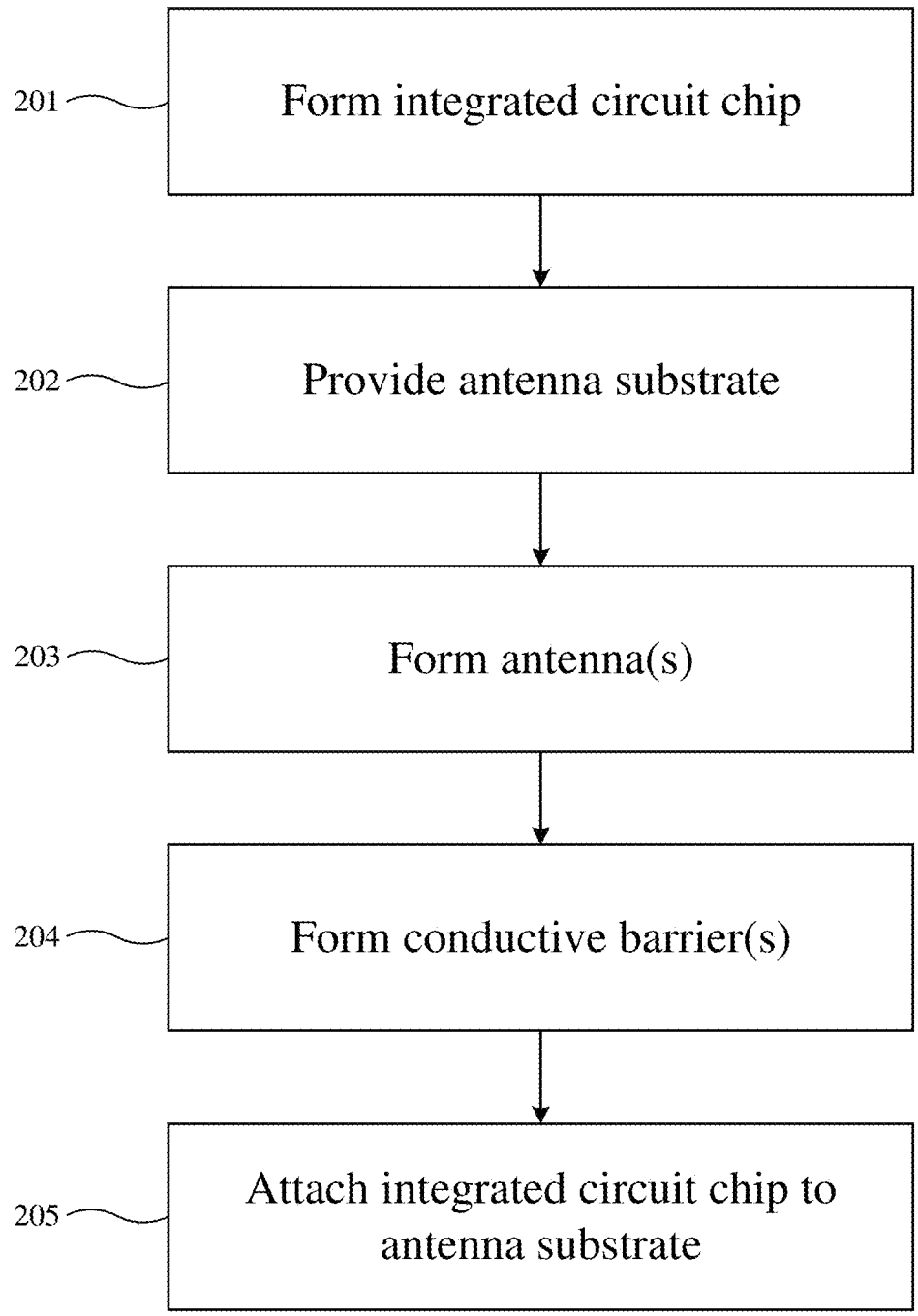
FIG. 8 illustrates a method of forming a radio frequency package device in accordance with an embodiment of the invention.

FIG. 8 illustrates a method of forming a radio frequency package device in accordance with an embodiment of the invention.

Referring to FIG. 8, an integrated circuit chip is formed in step 201. The integrated circuit chip may include radio frequency front end circuitry for transmitting/receiving radio signals as previously described. The integrated circuit chip may also include additional circuitry depending on application. An antenna substrate is provided in step 202. The antenna substrate may include features as described in previous embodiments. One or more antennas and one or more conductive barriers are formed on the antenna substrate in step 203 and step 204 respectively. The antennas and conductive barriers may be as described in previous embodiments. The integrated circuit chip is then attached to the antenna substrate to form the radio frequency device package in step 205.

The steps described above are representative of one possible method of forming a radio frequency device package, but other variations may exist. For example, the antennas and conductive barriers may be formed on the antenna substrate before forming the integrated circuit chip. The integrated circuit chip may also be attached at any time during the formation process. Additional steps may also be added to form other elements described in previous embodiments. Additional steps may also include additional packaging and/or attachment of the radio frequency device package to an external support. Other variations will be apparent by one skilled in the art.

It should be noted that the designations of "top" and "bottom" in reference to features of the invention are convenient labels and do not necessarily reflect the orientation of the features in all embodiments. For example, it may be conceivable for the embodiment radio frequency device packages described herein to be mounted with the top surface facing an external support. Therefore in some cases the top surface may more accurately be described as the bottom surface of the device package. Similarly, the radio frequency device packages may be attached at an angle relative to an external support or casing.

Example embodiments of the present invention are summarized here. Other embodiments can also be understood form the entirety of the specification and the claims filed herein.

Example 1

A semiconductor device package including: a radio frequency front end circuit configured to process radio frequency signals; a first antenna configured to transmit/receive a first radio frequency signal; an antenna substrate including the first antenna and configured to transfer the first radio frequency signal between the radio frequency front end circuit and the first antenna; and a first conductive barrier configured to electromagnetically and electrostatically isolate the first antenna.

Example 2

The semiconductor device package of example 1, where the antenna substrate further includes: a second antenna configured to transmit/receive a second radio frequency signal, where the antenna substrate further includes the second antenna and is configured to transfer the second radio frequency signal between the radio frequency front end circuit and the second antenna; and a second conductive barrier configured to electromagnetically and electrostatically isolate the second antenna.

Example 3

The semiconductor device package of example 2, where the first antenna is configured only to receive the first radio frequency signal and where the second antenna is configured only to transmit the second radio frequency signal.

Example 4

The semiconductor device package of example 1, where the radio frequency signals include a frequency between 55 GHz and 65 GHz, and where a gain of the first antenna is about 6 dBi.

Example 5

A semiconductor device package including: an integrated circuit chip including a radio frequency front end circuit for transmitting/receiving radio frequency signals; and an antenna substrate disposed over a first surface of the integrated circuit chip, the antenna substrate including a first antenna, and a first conductive barrier with sides extending in a direction perpendicular to a first surface of the antenna substrate, where the first conductive barrier is disposed along a periphery of the first antenna.

Example 6

The semiconductor device package of example 5, where the antenna substrate further includes: a first conductive layer disposed over the first surface of the integrated circuit chip, where the first conductive layer includes a first transmission line electrically coupled to the radio frequency front end circuit; and a first laminate layer disposed over the first conductive layer, where the first laminate layer includes an insulating material, where the first antenna is disposed over the first laminate layer and overlapping the first transmission line and the integrated circuit chip, and where the first antenna is coupled to the first transmission line.

Example 7

The semiconductor device package of example 6, where the antenna substrate further includes a via electrically coupled to the first transmission line and the first antenna.

Example 8

The semiconductor device package of one of examples 6 and 7, where the antenna substrate further includes: a second conductive layer disposed over the first laminate layer, where the second conductive layer is a ground plane, where the second conductive layer includes an opening overlapping the first transmission line, and where the first conductive barrier is disposed along a periphery of the opening.

Example 9

The semiconductor device package of example 8, where the first transmission line is electromagnetically coupled to the first antenna through the opening.

Example 10

The semiconductor device package of one of examples 5 to 9, where the first conductive barrier extends from the first surface of the antenna substrate to a second surface of the antenna substrate in the direction perpendicular to the first surface of the antenna substrate.

Example 11

The semiconductor device package of one of examples 5 to 9, where the first conductive barrier is along at least two adjacent sides of the first antenna.

Example 12

The semiconductor device package of one of examples 5 to 9, where the first conductive barrier surrounds all sides of the first antenna.

Example 13

The semiconductor device package of example 12, where the first conductive barrier is disposed on sides of an area having a shape of a rectangle.

Example 14

The semiconductor device package of one of examples 5 to 9, where the first conductive barrier is disposed only along edges of the antenna substrate.

Example 15

The semiconductor device package of one of examples 5 to 9, where the first conductive barrier includes metal line segments.

Example 16

The semiconductor device package of one of examples 5 to 14, where the first conductive barrier includes a first plurality of vias extending in a direction perpendicular to the first surface of the antenna substrate, the first plurality of vias disposed around the first antenna.

Example 17

The semiconductor device package of one of examples 5 to 14 and 16, where the first plurality of vias are disposed along a first side of the first antenna, along the first side, a first subset of the first plurality of vias is disposed along a first row, and along the first side, a second subset of the first plurality of vias is disposed along a second row different from the first row.

Example 18

The semiconductor device package of one of examples 5 to 14 and 16, where a spacing between adjacent vias of the first plurality of vias is substantially constant.

Example 19

The semiconductor device package of one of examples 5 to 14 and 16, where the first plurality of vias includes through vias.

Example 20

The semiconductor device package of one of examples 5 to 14 and 16 where the first plurality of vias includes rectangular and/or square vias.

Example 21

The semiconductor device package of one of examples 5 to 20, where the antenna substrate further includes: a second antenna; and a second conductive barrier with sides extending in the direction perpendicular to the first surface of the antenna substrate, where the second conductive barrier is disposed along a periphery of the second antenna.

Example 22

The semiconductor device package of one of examples 5 to 21, where the second conductive barrier is along at least two adjacent sides of the second antenna.

Example 23

The semiconductor device package of example 22, where: the first conductive barrier includes a first plurality of vias, first plurality of vias are spaced apart a first minimum distance, the second conductive barrier includes a second plurality of vias, the second plurality of vias are spaced apart a second minimum distance, and the first minimum distance and the second minimum distance are different.

Example 24

The semiconductor device package of one of examples 21 to 23, where the antenna substrate further includes a third antenna, a fourth antenna, a fifth antenna, and a sixth antenna, and where an area of a major surface of the semiconductor device package is less than 10 mm by 10 mm.

Example 25

The semiconductor device package of example 24, where the first antenna and the third antenna are configured to transmit radio signals, and where the second antenna, fourth antenna, fifth antenna, and sixth antenna are configured to receive radio signals.

Example 26

A method of forming a radio frequency device package, the method including: forming an integrated circuit chip including a radio frequency front end circuit; providing an antenna substrate; forming a first antenna at the antenna substrate; forming a first conductive barrier at the antenna substrate and along a periphery of the first antenna; and attaching the integrated circuit chip to a first surface of the antenna substrate, where the attaching includes coupling the first antenna to the radio frequency front end circuit.

Example 27

The method of example 26, further including: forming a second antenna at the antenna substrate; and forming a second conductive barrier at the antenna substrate and along a periphery of the second antenna, where the attaching further includes coupling the second antenna to the radio frequency front end circuit.

Example 28

The method of one of examples 26 and 27, where forming the first conductive barrier includes forming a plurality of vias in the antenna substrate.

Example 29

The method of example 28, where the plurality of vias extend from the first surface of the antenna substrate to a second surface of the antenna substrate, the second surface being opposite the first surface.

Example 30

The method of one of examples 26 to 28, where forming the first antenna includes forming a patch antenna on a second surface of the antenna substrate, the second surface being opposite the first surface.

Example 31

A semiconductor device package including: an integrated circuit chip including a radio frequency front end circuit for transmitting/receiving radio frequency signals; and an antenna substrate disposed over a first surface of the integrated circuit chip, the antenna substrate including a first conductive layer disposed over the first surface of the integrated circuit chip, where the first conductive layer includes a first transmission line electrically coupled to the radio frequency front end circuit, a first laminate layer disposed over the first conductive layer, where the first laminate layer includes an insulating material, and a first antenna disposed over the first laminate layer and overlapping the first transmission line and the integrated circuit chip, where the first antenna is coupled to the first transmission line, where a first side of the first antenna is spaced from a first edge of the antenna substrate by a first distance that is less than a major dimension of the first antenna.

Example 32

The semiconductor device package of example 31, where the first conductive layer further includes a second transmission line electrically coupled to the radio frequency front end circuit, and where the antenna substrate further includes: a second antenna disposed over the first laminate layer and overlapping the second transmission line, where the second antenna is coupled to the second transmission line, and where the second antenna is spaced from the first antenna by a second distance that is less than double the major dimension of the first antenna.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device package comprising:
    a radio frequency front end circuit configured to process radio frequency signals;
    an antenna substrate comprising a first conductive layer, a first insulating layer disposed over the first conductive layer, a second conductive layer disposed over the first insulating layer, a second insulating layer disposed over the second conducive layer, a third conductive layer disposed over the second insulating layer, a third insulating layer disposed over the third conductive layer, and a fourth conductive layer disposed over the third insulating layer;
    a first antenna disposed in the antenna substrate and configured to transmit/receive a first radio frequency signal, the first antenna comprising a first peripheral ground plane section in the first conductive layer, a first antenna feedline portion in the second conductive layer that is operatively coupled to the radio frequency front end circuit, a first interior ground plane in the third conductive layer, and a first patch antenna portion in the fourth conductive layer, wherein the first interior ground plane comprises an opening disposed over the first antenna feedline portion;
    a first conductive barrier configured to electromagnetically and electrostatically isolate the first antenna, the first conductive barrier extending from the first conductive layer to the fourth conductive layer;
    a second antenna disposed in the antenna substrate and configured to transmit/receive a second radio frequency signal, the second antenna comprising a second peripheral ground plane section in the first conductive layer, a second antenna feedline portion in the second conductive layer that is operatively coupled to the radio frequency front end circuit, a second interior ground plane in the third conductive layer, and a second patch antenna portion in the fourth conductive layer, wherein the second interior ground plane comprises an opening disposed over the second antenna feedline portion; and
    a second conductive barrier configured to electromagnetically and electrostatically isolate the second antenna from the first antenna, wherein the second conductive barrier extends from the first conductive layer to the fourth conductive layer, the second conductive barrier is disposed along a periphery of the second antenna, and a first edge of the first conductive barrier closest to the second antenna is spaced apart from a first edge of the second conductive barrier closest to the first antenna.

2. The semiconductor device package of claim 1, wherein the first antenna is configured only to receive the first radio frequency signal and wherein the second antenna is configured only to transmit the second radio frequency signal.

3. The semiconductor device package of claim 1, wherein the radio frequency signals comprise a frequency between 55 GHz and 65 GHz, and wherein a gain of the first antenna is about 6 dBi.

4. A semiconductor device package comprising:
    an integrated circuit chip comprising a radio frequency front end circuit for transmitting/receiving radio frequency signals; and
    an antenna substrate disposed over a first surface of the integrated circuit chip, the antenna substrate comprising
        a first conductive layer,
        a first insulating layer disposed over the first conductive layer,
        a second conductive layer disposed over the first insulating layer,
        a second insulating layer disposed over the second conducive layer,
        a third conductive layer disposed over the second insulating layer,
        a third insulating layer disposed over the third conductive layer, and
        a fourth conductive layer disposed over the third insulating layer,
        a first antenna disposed in the antenna substrate, the first antenna comprising a first peripheral ground plane section in the first conductive layer, a first antenna feedline portion in the second conductive layer that is operatively coupled to the radio frequency front end circuit, a first interior ground plane in the third conductive layer, and a first patch antenna portion in the fourth conductive layer, wherein the first interior ground plane comprises an opening disposed over the first antenna feedline portion,
        a first conductive barrier with sides extending in a direction perpendicular to a first surface of the antenna substrate, wherein the first conductive barrier is disposed along a periphery of the first antenna, the first conductive barrier extending from the first conductive layer to the fourth conductive layer,
        a second antenna disposed in the antenna substrate, the second antenna comprising a second peripheral ground plane section in the first conductive layer, a second antenna feedline portion in the second conductive layer that is operatively coupled to the radio frequency front end circuit, a second interior ground plane in the third conductive layer, and a second patch antenna portion in the fourth conductive layer, wherein the second interior ground plane comprises an opening disposed over the second antenna feedline portion, and
        a second conductive barrier with sides extending in the direction perpendicular to the first surface of the antenna substrate, wherein the second conductive barrier extends from the first conductive layer to the fourth conductive layer, the second conductive barrier is disposed along a periphery of the second antenna, wherein a first edge of the first conductive barrier closest to the second antenna is spaced apart from a first edge of the second conductive barrier closest to the first antenna.

5. The semiconductor device package of claim 4, wherein the first conductive barrier extends from the first surface of the antenna substrate to a second surface of the antenna substrate in the direction perpendicular to the first surface of the antenna substrate.

6. The semiconductor device package of claim 4, wherein the first conductive barrier is along at least two adjacent sides of the first antenna.

7. The semiconductor device package of claim 4, wherein the first conductive barrier surrounds all sides of the first antenna.

8. The semiconductor device package of claim 4, wherein the first conductive barrier comprises metal line segments.

9. The semiconductor device package of claim 4, wherein the first conductive barrier comprises a first plurality of vias extending in the direction perpendicular to the first surface of the antenna substrate, the first plurality of vias disposed around the first antenna.

10. The semiconductor device package of claim 9, wherein
the first plurality of vias are disposed along a first side of the first antenna,
along the first side, a first subset of the first plurality of vias is disposed along a first row, and
along the first side, a second subset of the first plurality of vias is disposed along a second row different from the first row.

11. The semiconductor device package of claim 9, wherein a spacing between adjacent vias of the first plurality of vias is substantially constant.

12. The semiconductor device package of claim 9, wherein the second conductive barrier comprises a second plurality of vias extending in the direction perpendicular to the first surface of the antenna substrate, and the second plurality of vias are disposed around the second antenna.

13. The semiconductor device package of claim 4, wherein the second conductive barrier is along at least two adjacent sides of the second antenna.

14. The semiconductor device package of claim 13, wherein the second conductive barrier surrounds all sides of the second antenna.

15. The semiconductor device package of claim 4, wherein the second conductive barrier surrounds all sides of the second antenna.

16. A method of forming a radio frequency device package, the method comprising:
forming an integrated circuit chip comprising a radio frequency front end circuit;
providing an antenna substrate comprising a first conductive layer, a first insulating layer disposed over the first conductive layer, a second conductive layer disposed over the first insulating layer, a second insulating layer disposed over the second conducive layer, a third conductive layer disposed over the second insulating layer, a third insulating layer disposed over the third conductive layer, and a fourth conductive layer disposed over the third insulating layer;
forming a first antenna at the antenna substrate, the first antenna comprising a first peripheral ground plane section in the first conductive layer, a first antenna feedline portion in the second conductive layer that is operatively coupled to the radio frequency front end circuit, a first interior ground plane in the third conductive layer, and a first patch antenna portion in the fourth conductive layer, wherein the first interior ground plane comprises an opening disposed over the first antenna feedline portion;
forming a first conductive barrier at the antenna substrate and along a periphery of the first antenna, the first conductive barrier extending from the first conductive layer to the fourth conductive layer;
forming a second antenna at the antenna substrate, the second antenna comprising a second peripheral ground plane section in the first conductive layer, a second antenna feedline portion in the second conductive layer that is operatively coupled to the radio frequency front end circuit, a second interior ground plane in the third conductive layer, and a second patch antenna portion in the fourth conductive layer, wherein the second interior ground plane comprises an opening disposed over the second antenna feedline portion;
forming a second conductive barrier at the antenna substrate and along a periphery of the second antenna, wherein the second conductive barrier extends from the first conductive layer to the fourth conductive layer, the second conductive barrier is disposed along the periphery of the second antenna, and a first edge of the first conductive barrier closest to the second antenna is spaced apart from a first edge of the second conductive barrier closest to the first antenna; and
attaching the integrated circuit chip to a first surface of the antenna substrate, wherein the attaching comprises coupling the first antenna and the second antenna to the radio frequency front end circuit.

17. The method of claim 16, wherein forming the first conductive barrier comprises forming a first plurality of vias in the antenna substrate.

18. The method of claim 17, wherein the first plurality of vias extend from the first surface of the antenna substrate to a second surface of the antenna substrate, the second surface being opposite the first surface.

19. The method of claim 17, wherein forming the second conductive barrier comprises forming a second plurality of vias in the antenna substrate.

20. The method of claim 16, wherein forming the first antenna comprises forming a patch antenna on a second surface of the antenna substrate, the second surface being opposite the first surface.

* * * * *